(12) United States Patent
Hwang et al.

(10) Patent No.: US 11,259,404 B2
(45) Date of Patent: Feb. 22, 2022

(54) RIGID-FLEXIBLE PRINTED CIRCUIT BOARD AND ELECTRONIC COMPONENT MODULE

(71) Applicant: SAMSUNG ELECTRO-MECHANICS CO., LTD., Suwon-si (KR)

(72) Inventors: Jun Oh Hwang, Suwon-si (KR); Jae Ho Shin, Suwon-si (KR); Yun Je Ji, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/811,146

(22) Filed: Mar. 6, 2020

(65) Prior Publication Data

US 2021/0212201 A1 Jul. 8, 2021

(30) Foreign Application Priority Data

Jan. 6, 2020 (KR) .................. 10-2020-0001422

(51) Int. Cl.
| | | |
|---|---|---|
| H05K 1/00 | (2006.01) | |
| H05K 1/02 | (2006.01) | |
| H05K 1/18 | (2006.01) | |
| H05K 3/00 | (2006.01) | |
| H05K 9/00 | (2006.01) | |

(52) U.S. Cl.
CPC .......... *H05K 1/0278* (2013.01); *H05K 1/189* (2013.01); *H05K 3/0014* (2013.01); *H05K 9/0024* (2013.01); *H05K 2201/0195* (2013.01); *H05K 2201/10128* (2013.01)

(58) Field of Classification Search
CPC .... H05K 1/0278; H05K 1/189; H05K 3/0014; H05K 9/0024; H05K 2201/0195; H05K 2201/10128
USPC .................................................. 361/760, 750
See application file for complete search history.

(56) References Cited

U.S. PATENT DOCUMENTS

| | | | | |
|---|---|---|---|---|
| 6,483,037 | B1* | 11/2002 | Moore ................. | H05K 1/0278 174/254 |
| 8,093,502 | B2* | 1/2012 | Mikado ............... | H05K 3/4691 174/255 |
| 9,018,532 | B2* | 4/2015 | Wesselmann ........... | H05K 3/36 174/254 |
| 2010/0051325 | A1* | 3/2010 | Sato ....................... | H05K 3/064 174/254 |
| 2019/0027443 | A1* | 1/2019 | Murtuza ............... | H01L 23/552 |

FOREIGN PATENT DOCUMENTS

JP 5600030 B2 10/2014

* cited by examiner

*Primary Examiner* — Andargie M Aychillhum
(74) *Attorney, Agent, or Firm* — Morgan, Lewis & Bockius LLP

(57) ABSTRACT

A printed circuit board includes a first rigid region and a flexible region, connected to the first rigid region and adjacent thereto in a first direction. The first rigid region has a thickness greater than a thickness of the flexible region, and the flexible region has a plurality of curved portions.

29 Claims, 23 Drawing Sheets

RIGID-FLEXIBLE PRINTED CIRCUIT BOARD AND ELECTRONIC COMPONENT MODULE

CROSS-REFERENCE TO RELATED APPLICATION(S)

This application claims the benefit under 35 USC 119(a) of Korean Patent Application No. 10-2020-0001422 filed on Jan. 6, 2020 in the Korean Intellectual Property Office, the entire disclosure of which is incorporated herein by reference for all purposes.

BACKGROUND

1. Field

The present disclosure relates to a rigid-flexible printed circuit board. The present disclosure also relates to an electronic component module in which an electronic component is mounted on a rigid-flexible printed circuit board.

2. Description of Related Art

With the recent advent of electronic devices such as foldable mobile phones, tablet personal computers (PCs), and the like, there is a need for a rigid-flexible printed circuit board having flexible characteristics to be bendable and/or foldable.

In addition, with market demand fueling a trend for significant reductions in sizes of electronic components, there is a need for miniaturization and thinning of a printed circuit board and an electronic component module in which an electronic component is mounted on such a printed circuit board.

SUMMARY

An aspect of the present disclosure is to provide a rigid-flexible printed circuit board which may be thinned while being bendable and/or foldable.

Another aspect of the present disclosure is to provide an electronic component module which may be thinned.

According to an aspect of the present disclosure, a printed circuit board includes a first rigid region, and a flexible region connected to the first rigid region and adjacent thereto in a first direction. The first rigid region has a thickness greater than a thickness of the flexible region, and the flexible region has a plurality of curved portions.

According to an aspect of the present disclosure, an electronic component module includes a printed circuit board having a first rigid region and a flexible region connected to the first rigid region and adjacent thereto in a first direction, and an electronic component disposed on the first rigid region of the printed circuit board. The flexible region has a plurality of curved portions.

According to another aspect of the present disclosure, a printed circuit board includes a first rigid region extending in a plane in a first direction, and a flexible region connected to the first rigid region, having a lower modulus of elasticity than the first rigid region, and adjacent to the first rigid region in the first direction. An insulating layer extends across the first rigid region and the flexible region, and the insulating layer in the first rigid region is planar and the insulating layer in the flexible region extends outside of a plane of the insulating layer in the first rigid region.

BRIEF DESCRIPTION OF DRAWINGS

The above and other aspects, features, and advantages of the present disclosure will be more clearly understood from the following detailed description, taken in conjunction with the accompanying drawings.

FIGS. 21A and 21B are schematic cross-sectional views of a structure in which a printed circuit board is combined with another element such as a display or the like.

DETAILED DESCRIPTION

Hereinafter, embodiments of the present disclosure will be described as follows with reference to the attached drawings.

Printed Circuit Board

Figure 1:
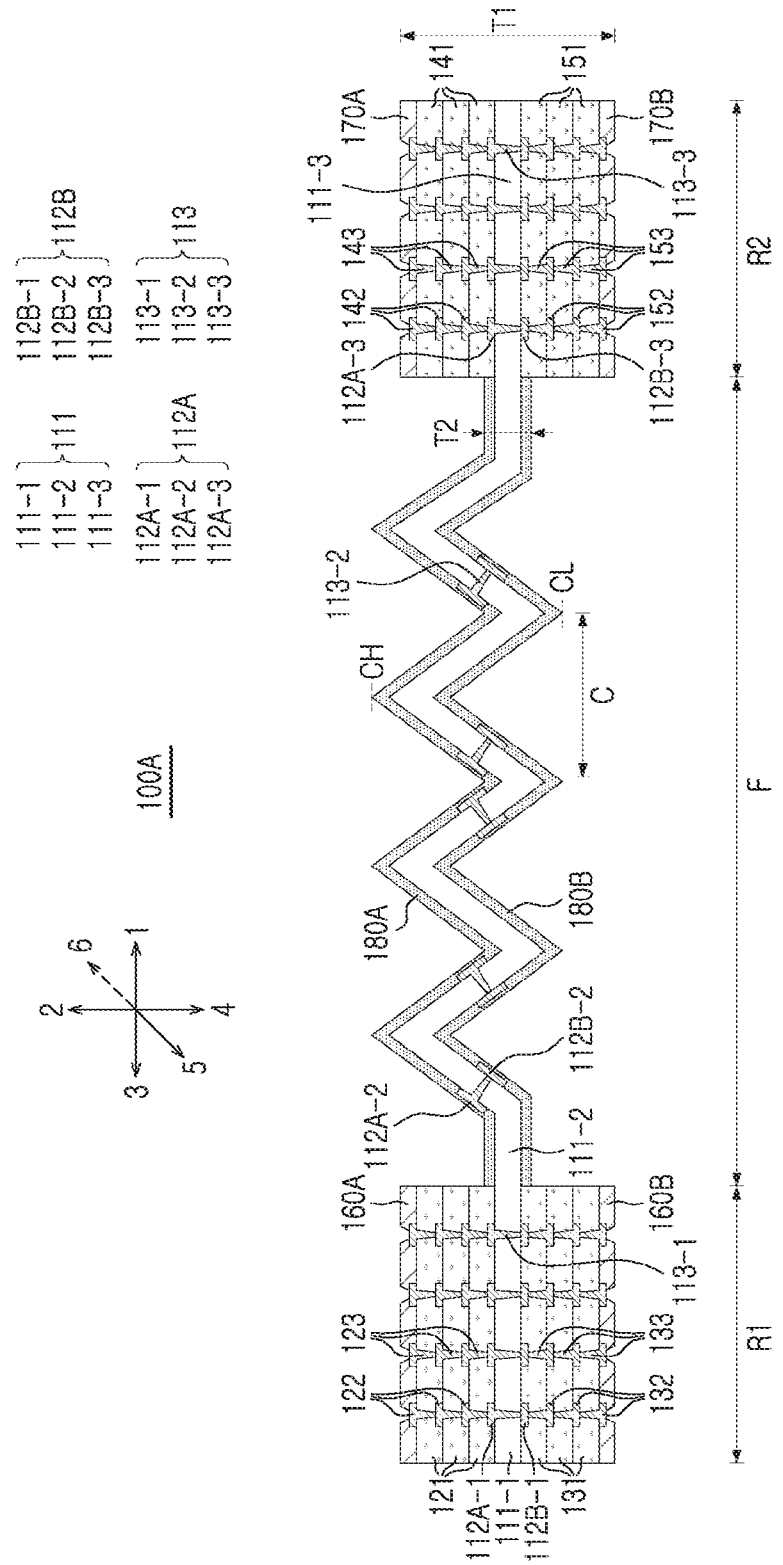
FIG. 1 is a schematic cross-sectional view of a printed circuit board according to an example.

FIG. 1 is a schematic cross-sectional view of a printed circuit board 100A according to an example.

In the drawings, shapes, sizes, and the like, of elements may be exaggerated or briefly illustrated for clarity of description. In particular, shapes and sizes, and the like, of a curved portion C to be described later and elements included in the curved portion C will be exaggerated to emphasize features thereof.

Referring to FIG. 1, the printed circuit board 100A according to an example may have a first rigid region R1, a flexible region F connected to the first rigid region R1 in a first direction, and a second rigid region R2 connected to the flexible region F in the first direction.

In addition, the printed circuit board 100A may include a first insulating layer 111, a first wiring layer 112A disposed on one surface of the first insulating layer 111, a second wiring layer 112B disposed on another surface opposing the one surface of the first insulating layer 111, and a first via 113 penetrating through the second wiring layer 112B and the first insulating layer 111 and connecting the first wiring layer 112A and the second wiring layer 112B to each other.

The first insulating layer 111 may have a first region 111-1 in the first rigid region R1, a second region 111-2 in the flexible region F, and a third region 111-3 in the second rigid region R2. Similarly, the first wiring layer 112A may have a first region 112A-1 in the first rigid region R1, a second region 112A-2 in the flexible region F, and a third region 112A-3 in the second rigid region R2, and the second wiring layer 112B may have a first region 112B-1 in the first rigid region R1, a second region 112B-2 in the flexible region F, and a third region 112B-3 in the second rigid region R2. In addition, the first via 113 may have a first region 113-1 in the first rigid region R1, a second region 113-2 in the flexible region F, and a second region 113-3 in the second rigid region R2.

The printed circuit board 100A may further include a plurality of second insulating layers 121 including a second insulating layer 121 disposed on the one surface of the first region 111-1 of the first insulating layer 111 and covering the first region 112A-1 of the first wiring layer 112A in the first rigid region R1, a plurality of third wiring layers 122, respectively disposed on the plurality of second insulating layers 121, a plurality of second vias 123, respectively penetrating through the plurality of second insulating layers 121 and respectively connected to the plurality of third wiring layers 122, a plurality of third insulating layers 131 including a third insulating layer 131 disposed on the other surface of the first region 111-1 of the first insulating layer 111 and covering the first region 112B-1 of the second wiring layer 112B, a plurality of fourth wiring layers 132, respectively disposed on the plurality of third insulating layers 131, and a plurality of third vias 133, respectively penetrating through the plurality of third insulating layers 131 and respectively connected to the plurality of fourth wiring layers 132.

The printed circuit board 100A may further include a first passivation layer 160A, disposed on the plurality of second insulating layers 121 in the first rigid region R1, and a second passivation layer 160B disposed on the plurality of third insulating layers 131 in the first rigid region R1.

The printed circuit board 100A may further include a first coverlay layer 180A, disposed on one surface of the second region 111-2 of the first insulating layer 111 and covering the second region 112A-2 of the first wiring layer 112A in the flexible region F, and a second coverlay layer 180B disposed on the other surface of the second region 111-2 of the first insulating layer 111 and covering the second region 112B-2 of the second wiring layer 112B.

The printed circuit board 100A may further include a plurality of fourth insulating layers 141 disposed on the one surface of the third region 111-3 of the first insulating layer 111 and including a fourth insulating layer 141 covering the third region 112A-3 of the first wiring layer 112A in the second rigid region R2, a plurality of fifth wiring layers 142, respectively disposed on the plurality of fourth insulating layers 141, a plurality of fourth vias 143, respectively penetrating through the plurality of fourth insulating layers 141 and respectively connected to the plurality of fifth wiring layers 142, a plurality of fifth insulating layers 151 disposed on the other surface of the third region 111-3 of the first insulating layer 111 and including a fifth insulating layer 151 covering the third region 112B-3 of the second wiring layer 112B, a plurality of sixth wiring layers 152, respectively disposed on the plurality of fifth insulating layers 151, and a plurality of vias 153, respectively penetrating through the plurality of fifth insulating layers 151 and respectively connected to the plurality of wiring layers 152.

The printed circuit board 100A may further include a third passivation layer 170A, disposed on the plurality of fourth insulating layers 141 in the second rigid region R2, and a fourth passivation layer 170B disposed on the plurality of fifth insulating layers 151.

For example, each of the first insulating layer 111, the first wiring layer 112A, the second wiring layer 112B, and the first via 113 has a first region in the first rigid region R1, a second region in the flexible region F, and a third region in the second rigid region R2 of the printed circuit board 100A.

Accordingly, the first rigid region R1 of the printed circuit board 100A includes the first region 111-1 of the first insulating layer 111, the first region 112A-1 of the first wiring layer 112A disposed on the one surface of the first region 111-1 of the first insulating layer 111, the first region 112B-1 of the second wiring layer 112B disposed on the other surface of the first region 111-1 of the first insulating layer 111, the first region 113-1 penetrating through the first region 111-1 of the first insulating layer 111 and connecting the first region 112A-1 of the first wiring layer 112A and the first region 112B-1 of the second wiring layer 112B to each other, the plurality of second insulating layers 121 disposed on one surface of the first region 111-1 of the first insulating layer 111, the plurality of third wiring layers 122, respectively disposed on the plurality of second insulating layers 121, the plurality of second vias 123, respectively penetrating through the plurality of second insulating layers 121 and respectively connected to the plurality of third wiring layers 122, the first passivation layer 160A disposed on the plurality of second insulating layers 121, the plurality of third insulating layers 131 disposed on the other surface of the first region 111-1 of the first insulating layer 111, the plurality of fourth wiring layers 132, respectively disposed on the plurality of third insulating layers 131, the plurality of third vias 133, respectively penetrating through the plurality of third insulating layers 131 and respectively connected to the plurality of fourth wiring layers 132, and the second passivation layer 160B disposed on the plurality of third insulating layers 131.

In addition, the flexible region F of the printed circuit board 100A includes a second region 111-2 of the first insulating layer 111, the second region 112A-2 of the first wiring layer 112A disposed on one surface of the second region 111-2 of the first insulating layer 111, the second region 112B-2 of the second wiring layer 112B disposed on the other surface of the second region 111-2 of the first insulating layer 111, the second region 113-2 of the first via 113 penetrating through the second region 111-2 of the first insulating layer 111 and connecting the second region 112A-2 of the first wiring layer 112A and the second region 112B-2 of the second wiring layer 112B to each other, the first coverlay layer 180A disposed on the one surface of the second region 111-2 of the first insulating layer 111 and covering the second region 112A-2 of the first wiring layer 112A, and a second coverlay layer 180B disposed on the other surface of the second region 111-2 of the first insulating layer 111 and covering the second region 112B-2 of the second wiring layer 112B.

In addition, the second rigid region R2 of the printed circuit board 100A includes a third region 111-3 of the first insulating layer 111, the third region 112A-3 of the first wiring layer 112A disposed on the one surface of the third region 111-3 of the first insulating layer 111, the third region 112B-3 of the second wiring layer 112B disposed on the other surface of the third region 111-3 of the first insulating layer 111, the third region 113-3 of the first via 113 penetrating through the third region 111-3 of the first insulating layer 111 and connecting the third region 112A-3 of the first wiring layer 112A and the third region 112B-3 of the second wiring layer 112B to each other, the plurality of fourth insulating layers 141 disposed on the one surface of the third region 111-3 of the first insulating layer 111, the plurality of fifth wiring layers 142, respectively disposed on the plurality of fourth insulating layers 141, the plurality of fourth vias 143, respectively penetrating through the plurality of fourth insulating layers 141 and respectively connected to the plurality of fifth wiring layers 142, the third passivation layer 170A disposed on the plurality of fourth insulating layers 141, the plurality of fifth insulating layers 151 disposed on the other surface of the third region 111-3 of the first insulating layer 111, the plurality of sixth wiring layers 152, respectively disposed on the plurality of fifth insulating layers 151, a plurality of fifth vias 153, respectively penetrating through the plurality of fifth insulating layers 151 and respectively connected to the plurality of sixth wiring layers 152, and the fourth passivation layer 170B disposed on the plurality of fifth insulating layers 151.

The flexible region F refers to a region which is more easily bent or folded than each of the first rigid region R1 and the second rigid region R2. On the other hand, each of the first rigid region R1 and the second rigid region R2 refers to a region that is more difficult to be bent or folded than the flexible region F. For example, the terms "the flexible region F," "the first rigid region R1," and "the second rigid region R2" are used to describe relative characteristics between the respective regions, and the first rigid region R1 and the second rigid region R2 are not interpreted as unbendable or unfoldable regions.

The flexible region F is connected to the first rigid region R1 in the first direction, and the second rigid region R2 is connected to the flexible region F in the first direction. For example, the first rigid region R1, the flexible region F, and the second rigid region R2 are sequentially disposed along the first direction. Since the flexible region F is disposed between the first rigid region R1 and the second rigid region R2, the first rigid region R1 and the second rigid region R2 may be spaced apart from each other by the flexible region F to face each other. In addition, the flexible region F may serve to connect the wiring layers, respectively disposed in the first rigid region R1 and the second rigid region R2, to each other.

Each of the first rigid region R1 and the second rigid region R2 has a thickness T1 greater than a thickness T2 of the flexible region F. In this application, a thickness of a certain element refers to a distance between an outermost side surface of a certain element in the second direction and an outermost side surface of the certain element in the fourth direction, disposed to oppose each other. As an example, on the basis of the drawing, the thickness T1 of the first rigid region R1 of the printed circuit board 100A is a distance between an external surface of the first passivation layer 160A in the second direction 2 and an external surface of the second passivation layer 160B in the fourth direction 4. As another example, the thickness T2 of the flexible region F of the printed circuit board 100A is a distance between an external surface of the first coverlay layer 180A in the second direction 2 and an external surface of the second coverlay layer 180B in the fourth direction 4, disposed to oppose each other.

The flexible region F, the first rigid region R1, and the second rigid region R2 of the printed circuit board 100A may have the same width or have widths different from each other. The term "width" refers to a distance between an outermost side surface in a fifth direction 5, perpendicular to the first direction 1 on a plane, and an outermost side surface in a sixth direction 6 perpendicular to the first direction 1 on the plane.

As will be described later, a plurality of second insulating layers 121, a plurality of third insulating layers 131, a plurality of fourth insulating layers 141, and a plurality of fifth insulating layers 151 may have the same thickness as each other and may each include the same number of layers, but may alternatively have different thicknesses and/or different number of layers unlike what is shown in the drawing.

The flexible region F of the printed circuit board 100A has a plurality of curved portions C. The curved portion C is curved in the second direction 2 and the fourth direction 4. For example, the curved shape C has a highest point CH and a lowest point CL disposed on different levels in the second direction. In addition, the curved shape C may have elasticity and/or flexibility. Accordingly, a distance between straight lines, respectively passing through the highest point CH and the lowest point CL and running parallel to the first direction and the third direction, may vary.

The shape of the curved portion C is not necessarily limited. For example, as illustrated in the drawing, each curved portion C may have a V or angular zigzag shape. Thus, the entire curved portion C may have a zigzag shape, but the shape thereof is not limited thereto. A plurality of curved portions C may have the same shape or different shapes to each other.

The number of the curved portions C is also not necessarily limited. The number of curved portions C may be more or less than is illustrated in the drawing.

Figure 21A:
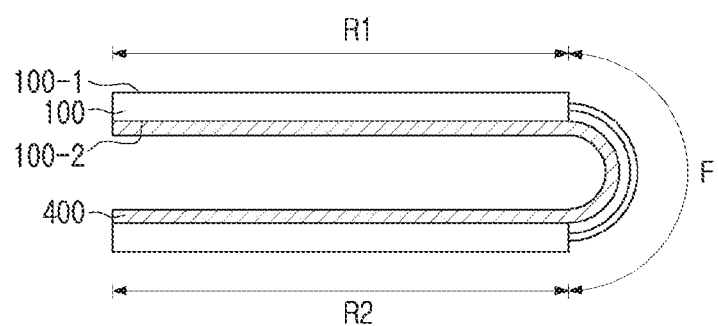
Figure 21B:
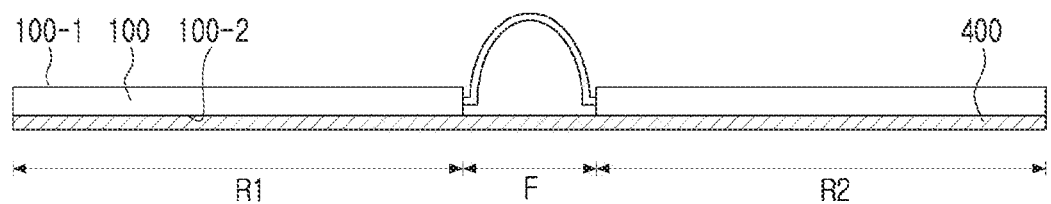

FIGS. 21A and 21B are schematic cross-sectional views of a structure in which a printed circuit board 100 is combined with another element such as a display or the like.

The printed circuit board 100 has a first surface 100-1 and a second surface 100-2, and a foldable display 400 is disposed on the second surface 100-2 of the printed circuit board 100. However, an element disposed on the second surface 100-2 of the printed circuit board 100 is not limited to the display 400. An electronic component, or the like, may alternatively or additionally be mounted on the first surface 100-1 of the printed circuit board 100.

The printed circuit board 100 is a rigid-flexible printed circuit board having a first rigid region R1, a flexible region F, and a second rigid region R2, and is bendable and/or foldable in the flexible region F. In the display 400, a region corresponding to the flexible region F of the printed circuit board 100 is foldable. Accordingly, when the printed circuit board 100 is folded, the region corresponding to the flexible region F of the printed circuit board 100 is also folded.

FIG. 21A illustrates a structure in which the printed circuit board 100 and the display 400 are folded together. In this case, the printed circuit board 100 and the display 400 in the flexible region F have different radii of curvature to each other. For example, the radius of curvature of the printed circuit board 100 is greater than the radius of curvature of the display 400. Accordingly, an arc of the printed circuit board 100 has a greater length than an arc of the display 400 in the flexible region F.

FIG. 21B illustrates a structure in which the printed circuit board 100 and the display 400 are unfolded together. As described above, the radius of curvature of the printed circuit board 100 is greater than the radius of curvature of the display 400. Accordingly, when the display 400 is unfolded, a portion of the printed circuit board 100 protrudes upwardly in the flexible region F, which inhibits thinning of a printed circuit board and an electronic component module including the printed circuit board.

As described above, in the case of the printed circuit board 100A, the flexible region F has a plurality of curved portions C having elasticity and/or flexibility. Accordingly, when the printed circuit board 100A is introduced into the printed circuit board 100 in FIGS. 21A and 21B, even in the case in which the printed circuit board 100 and the display 400 are unfolded together, a single protrusion may be prevented from being formed in the flexible region F of the printed circuit board 100A, and the printed circuit board 100A and an electronic component module including the printed circuit board 100A may thereby be thinned through the use of multiple thinner protrusions as shown in FIG. 1.

Figure 20A:
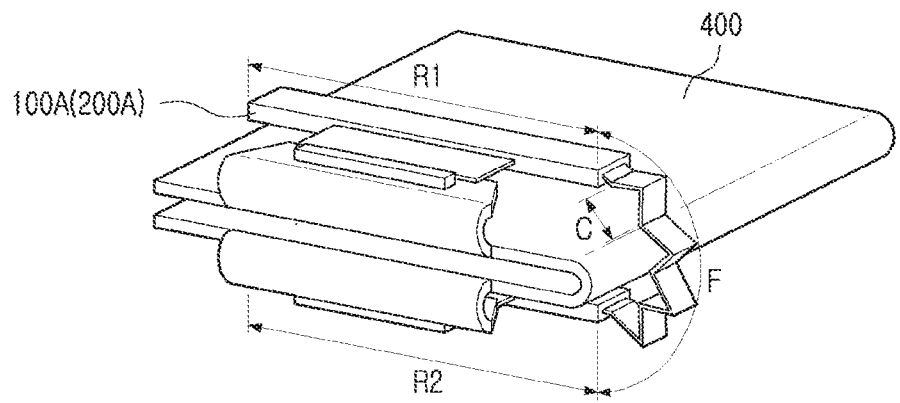
FIGS. 20A and 20B are schematic perspective views of an electronic component module in which another element such as a display, or the like, is additionally combined with a printed circuit board or an electronic component module according to an example.
Figure 20B:
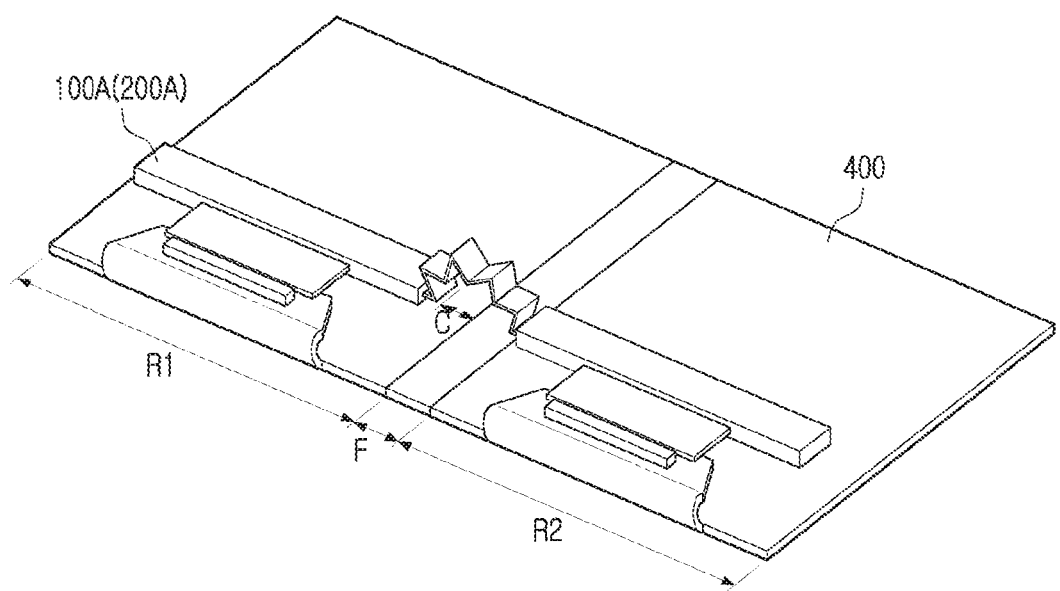

For example, FIG. 20B illustrates a structure in which the printed circuit board 100A and the display 400 are unfolded together, in the electronic component module. As illustrated in the drawings, the flexible region F of the printed circuit board 100A has a plurality of curved portions C, allowing a height of a protrusion formed in a central portion of the flexible region F of the printed circuit board 100A to be reduced. For example, the plurality of curved portions C having elasticity and flexibility may be relaxed and contracted as the printed circuit board 100A is folded and unfolded. A detailed description thereof will be given later.

Hereinafter, elements of a printed circuit board according to an example will be described with reference to accompanying drawings.

The first insulating layer 111 may have a relatively lower modulus of elasticity than each of the second to fourth insulating layers 121, 131, 141, and 151. For example, the first insulating layer 111 may be formed of a material relatively more flexible than a material of each of the second to fourth insulating layers 121, 131, 141, and 151. Accordingly, the first insulating layer 111 may be more easily bendable or foldable than each of the second to fourth insulating layers 121, 131, 141, and 151.

For example, a material of the first insulating layer 111 may be polyimide (PI), polyethylene terephthalate (PET), polyethylene naphthalate (PEN), polycarbonate (PC), polyethersulfone (PES), polyacrylate (PAR), liquid crystal polymer (LCP), and the like. In addition, the material of the first insulating layer 111 may not include (e.g., may be free of) a reinforcing material such as a glass fiber (glass cloth and glass fabric), or the like.

Accordingly, the printed circuit board 100A may be bent and/or folded by the first insulating layer 111 in the flexible region F. This is because the flexible region F does not include the second to fourth insulating layers 121, 131, 141, and 151, each having a higher modulus of elasticity than the first insulating layer 111.

The first insulating layer 111 may include a plurality of layers. In this case, materials, thicknesses, and the like, of the plurality of first insulating layers 111 may be the same or different from each other.

The first wiring layer 112A and the second wiring layer 112B may each provide various wirings, and are connected to each other by the first via 113. For example, each of the first and second wiring layers 112A and 112B may include a ground pattern, a power pattern, a signal pattern, and the like.

A material of each of the first and second wiring layers 112A and 112B may be a conductive material such as copper (Cu), aluminum (Al), silver (Ag), tin (Sn), gold (Au), and nickel (Ni), lead (Pb), titanium (Ti), or alloys thereof.

The first via 113 may penetrate through the first insulating layer 111 to connect the first wiring layer 112A and the second wiring layer 112B to each other. The first via 113 may perform various functions depending on a design. For example, the first via 113 may include a connection via for signal connection, a connection via for grounding connection, and a connection via for power connection.

A material of the first via 113 may be a conductive material such as copper (Cu), aluminum (Al), silver (Ag), tin (Sn), gold (Au), nickel (Ni), lead (Pb), titanium (Ti), or alloys thereof. The first via 113 may be a filled-type via in which a via hole is completely filled with a conductive material, or may be a conformal via in which a conductive material is formed along a wall of a via hole. When the first via 113 is a via in which a conductive material is formed along a wall of a via hole, the via hole may be filled with an insulating material. In addition, a shape of the first via 113 may be a cylindrical shape, a tapered shape, or the like.

The plurality of second insulating layers 121 are disposed on the one surface of the first region 111-1 of the first insulating layer 111, and includes a second insulating layer 121 covering the first regions 112A-1 of the first wiring layer 112A. The number of layers of the second insulating layer 121 may be greater or smaller than illustrated in the drawing. For example, the second insulating layer 121 may be a single second insulating layer 121.

The second insulating layer 121 may have a relatively higher modulus of elasticity than the first insulating layer 111. For example, the second insulating layer 121 may be formed of a material relatively more rigid than a material of the first insulating layer 111. Accordingly, the second insulating layer 121 may be more difficult to be bent or folded than the first insulating layer 111.

For example, a material of the second insulating layer 121 may be a thermosetting resin such as an epoxy resin, a thermoplastic resin such as a polyimide resin, an insulating material in which the thermosetting resin or the thermoplastic resin is impregnated in a core material, such as an inorganic filler and/or a glass fiber (or a glass cloth or a glass fabric), such as prepreg, Ajinomoto build-up film (ABF), FR-4, Bismaleimide Triazine (BT), or the like. As appropriate, the material of the second insulating layer 121 may include a photoimageable dielectric (PID) resin.

When the second insulating layer 121 includes a plurality of second insulating layers 121, materials and/or thicknesses of the plurality of second insulating layers 121 may be the same or different from each other.

The plurality of third wiring layers 122 may be disposed on the plurality of second insulating layers 121, respectively. The plurality of third wiring layers 122 may be respectively connected to each other through the plurality of second vias 123, respectively.

The third wiring layer(s) 122 may provide various wirings. For example, the third wiring layer(s) 122 may include a ground pattern, a power pattern, a signal pattern, and the like.

A material of third wiring layer (s) 122 may be a conductive material such as copper (Cu), aluminum (Al), silver (Ag), tin (Sn), gold (Au), nickel (Ni), lead (Pb), titanium (Ti), or alloys thereof.

Each of the plurality of second vias 123 may penetrate through one or more of the plurality of second insulating layers 121 to connect the plurality of third wiring layers 122 to each other. The plurality of second vias 123 may also connect the first wiring layer 111A and the third wiring layer 122 to each other. The second via (s) 123 may perform various functions depending on a design. For example, the second via(s) 123 may include a connection via for signal connection, a connection via for ground connection, and a connection via for power connection.

The plurality of third insulating layers 131 are disposed on the other surface of the first region 111-1 of the first insulating layer 111, and include a third insulating layer 131 covering the first regions 112B-1 of the second wiring layer 112B. A configuration, a material, and the like, of the third insulating layer 131 are the same as those of the second insulating layer 121.

The plurality of fourth wiring layers 132 may be disposed on the plurality of third insulating layers 131, respectively. The plurality of fourth wiring layers 132 may be connected to each other through the plurality of third vias 133, respectively. A configuration, a material, and the like, of the fourth wiring layer 132 are the same as those of the third wiring layer 122.

The plurality of third vias 133 may penetrate through the plurality of third insulating layers 131 to connect the plurality of fourth wiring layers 132 to each other, respectively. The plurality of third vias 133 may also connect the second wiring layer 112B and the fourth wiring layer 132 to each other. A configuration and a material of the third via 133 are the same as those of the second via 123.

The plurality of fourth insulating layers 141 are disposed on the one surface of the third region 111-3 of the first insulating layer 111, and include a fourth insulating layer 141 covering a third regions 112A-3 of the first wiring layer 112A. A configuration, a material, and the like, of the fourth insulating layer 141 are the same as those of the second insulating layer 121.

The plurality of fifth wiring layers 142 may be disposed on the plurality of fourth insulating layers 141, respectively. The plurality of fifth wiring layers 142 may be connected to each other through the plurality of fourth vias 143, respectively. A configuration, a material, and the like, of the fifth wiring layer 142 are the same as those of the third wiring layer 122.

The plurality of fourth vias 143 may penetrate through the plurality of fourth insulating layers 141 to connect the plurality of fifth wiring layers 142 to each other, respectively. The plurality of fourth vias 143 may also connect the first wiring layer 112A and the fifth wiring layer 142 to each other. A configuration, a material, and the like, of the fourth via 143 are the same as those of the second via 123.

The plurality of fifth insulating layers 151 are disposed on the other surface of the third region 111-3 of the first insulating layer 111, and includes a fifth insulating layer 151 covering the third regions 112B-3 of the second wiring layer 112B. A configuration, a material, and the like, of the fifth insulating layer 151 are the same as those of the second insulating layer 121.

The plurality of sixth wiring layers 152 may be disposed on the plurality of fifth insulating layers 151, respectively. The plurality of sixth wiring layers 152 may be connected to each other through the plurality of fifth vias 153, respectively. A configuration, a material, and the like, of the sixth wiring layer 152 are the same as those of the third wiring layer 122.

The plurality of fifth vias 153 may penetrate through the plurality of fifth insulating layers 151 to connect the plurality of sixth wiring layers 152 to each other, respectively. The plurality of fifth vias 153 may also connect the second wiring layer 112B and the sixth wiring layer 152 to each other. A configuration, a material, and the like, of the fifth via 153 are the same as those of the second via 123.

Thicknesses and the number of layers, included in each of the second to fifth insulating layers 121, 131, 141, and 151, may be the same. When the thicknesses and the number of layers, included in each of the second to fifth insulating layers 121, 131, 141, and 151, are the same, the printed circuit board 100A may have a double-sided symmetrical shape with respect to the first insulating layer 111 to reduce occurrence of warpage. However, the thicknesses and/or the number of layers, included in each of the second to fifth insulating layers 121, 131, 141, and 151, may be different from each other. For example, each of the second insulating layer 121 and the third insulating layer 131 may include three layers, and each of the fourth insulating layer 141 and the fifth insulating layer 151 may include two layers. Alternatively, at least one of the second insulating layer 121, the third insulating layer 131, the fourth insulating layer 141, and the fifth insulating layer 151 may be omitted.

Each of the second to fifth insulating layers 121, 131, 141, and 151 may include the same material, or may include different materials from each other.

When each of the second to fifth vias 123, 133, 143, and 153 has a tapered shape, the second to fifth vias 123, 133, 143, and 153 may have shapes tapered in the same direction or may have shapes tapered in directions opposing each other. For example, as illustrated in the drawings, the second via 123 and the fourth via 143 may have tapered shapes in which widths are decreased in the fourth direction, and the third via 133 and the fifth via 153 may have tapered shapes in which widths are increased in the fourth direction. Accordingly, it will be understood that the printed circuit board 100A has a double-sided build-up structure. However, a structure of the printed circuit board 100A is not limited thereto. In the case in which the printed circuit board 100A has a batch laminated structure, the second to fifth vias 123, 133, 143, and 153 may all have shapes tapered in the same direction.

The first passivation layer 160A is disposed on the uppermost second insulating layer 121, among the plurality of second insulating layers 121, based on the second direction and has an opening exposing at least a portion of the uppermost third wiring layer 122 based on the second direction.

The first passivation layer 160A may playa role in protecting an internal configuration of the printed circuit board 100A from external physical and chemical damages, and the like, and may be formed of a photosensitive insulating layer such as a solder resist (SR) layer. However, the first passivation layer 160A is not limited thereto and may include an insulating material such as Ajinomoto Build-up Film (ABF).

The second passivation layer 160B is disposed on the plurality of third insulating layers 131 and has an opening exposing at least a portion of the plurality of fourth wiring layers 132. A role, a material, and the like, of the second passivation layer 160B are the same as those of the first passivation layer 160A.

The third passivation layer 170A is disposed on the plurality of fourth insulating layers 141 and has an opening exposing at least a portion of the plurality of fifth wiring layers 142. A role, a material, and the like, of the third passivation layer 170A are the same as those of the first passivation layer 160A.

The fourth passivation layer 170B is disposed on the plurality of fifth insulating layers 151 and has an opening exposing at least a portion of the plurality of sixth wiring layers 152. A role, a material, and the like, of the fourth passivation layer 170B are the same as those of the first passivation layer 160A.

The first coverlay layer 180A is disposed on the one surface of the second region 111-2 of the first insulating layer 111 to cover the second region 112A-2 of the first wiring layer 112A. The second coverlay layer 180B is disposed on the other surface of the second region 111-2 of the first insulating layer 111 to cover the second region 112B-2 of the second wiring layer 112B.

The first coverlay layer 180A and the second coverlay layer 180B may serve to protect the second region 112A-2 of the first wiring layer 112A and the second region 112B-2 of the second wiring layer 112B, respectively. Each of the first coverlay layer 180A and the second coverlay layer 180B may include a coverlay film, and may further include a cover resin layer disposed on one surface of the coverlay film. For example, each of the first coverlay layer 180A and the second coverlay layer 180B may include a polyimide (PI) resin.

Figure 2A:
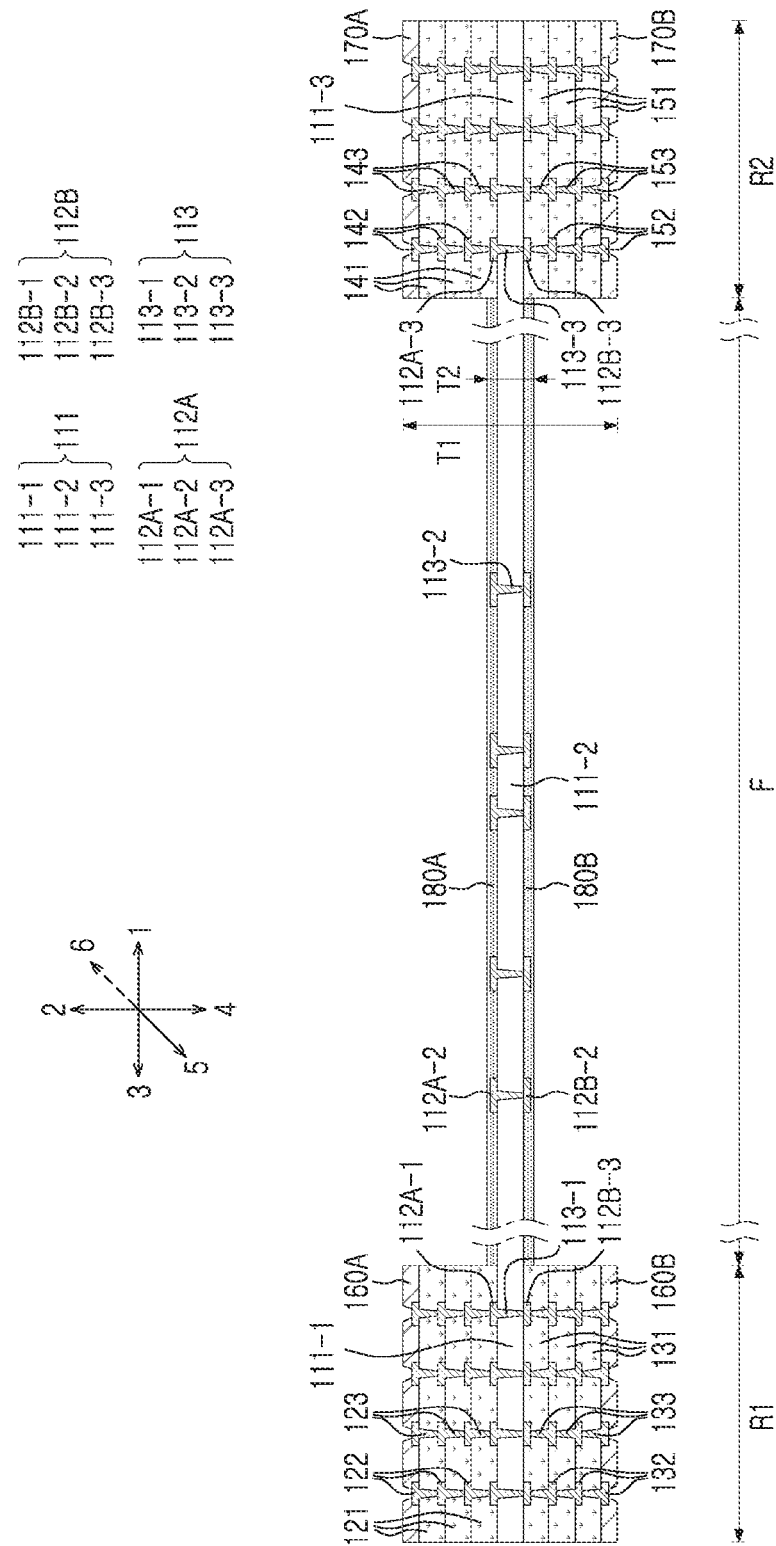
FIGS. 2A, 2B, and 2C are schematic views illustrating a portion of a manufacturing process of a printed circuit board according to an example.
Figure 2B:
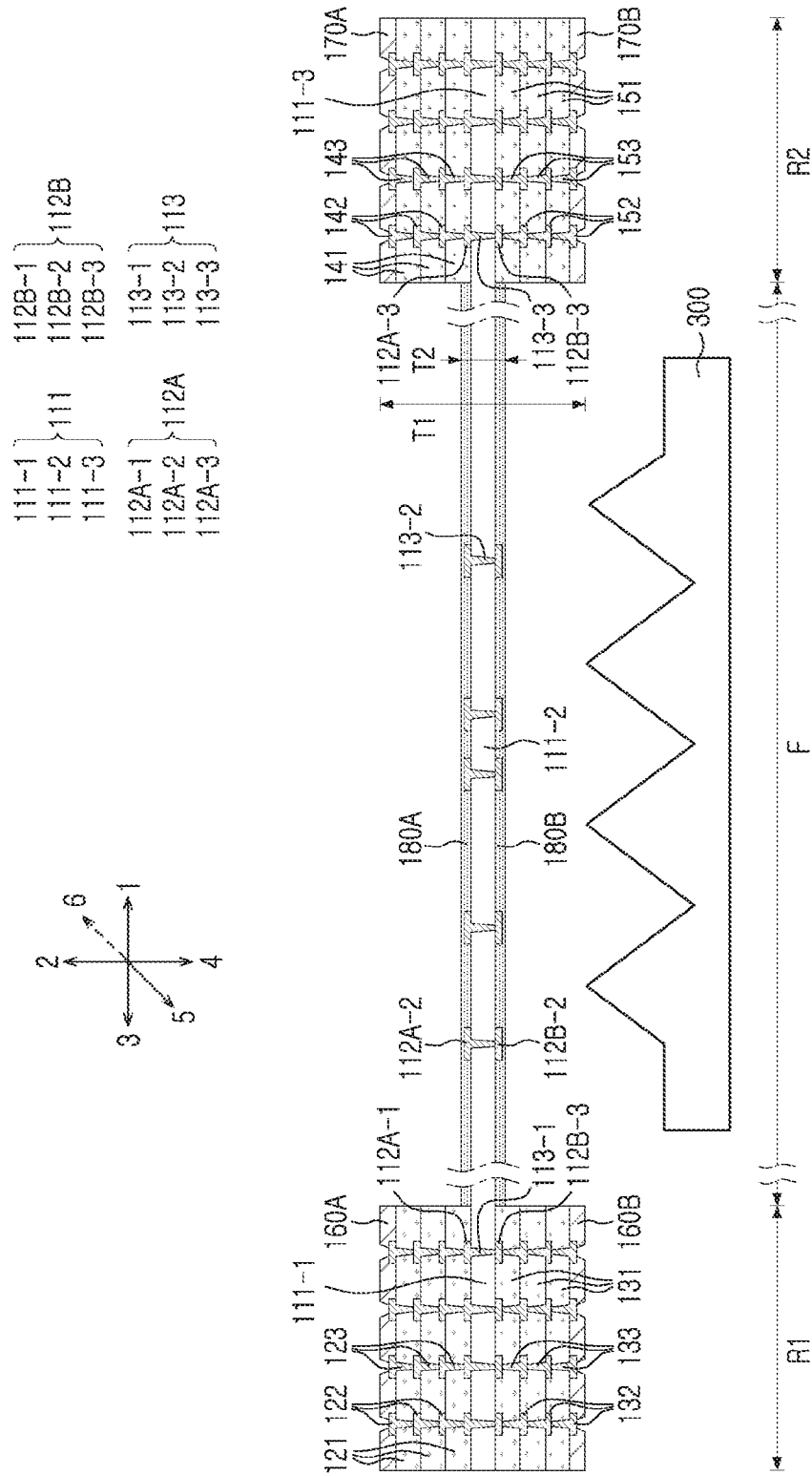
Figure 2C:
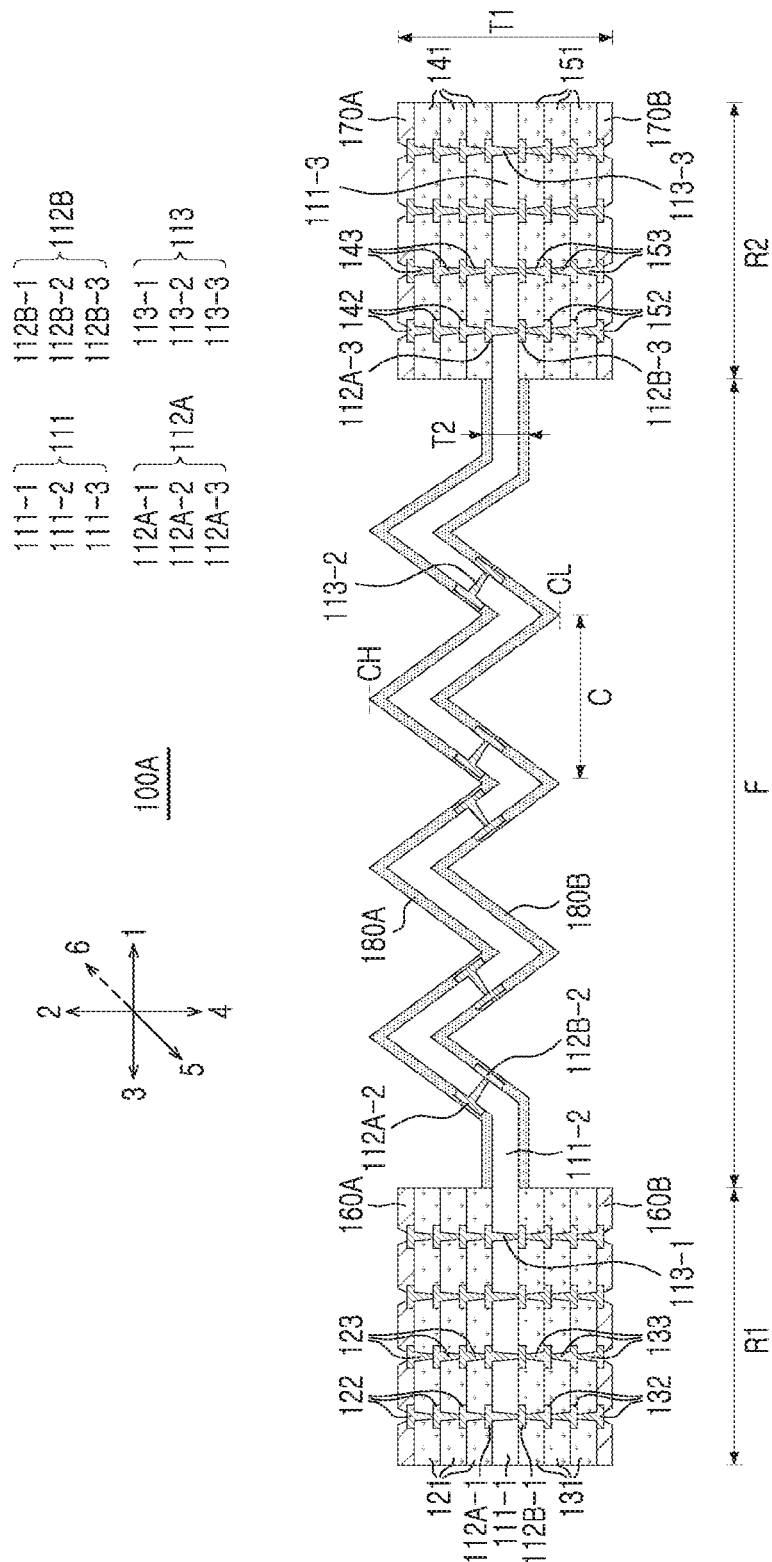

FIGS. 2A to 2C are schematic views illustrating a portion of a manufacturing process of a printed circuit board 100A according to an example.

FIG. 2A illustrates a printed circuit board 100A before a curved portion C is formed.

FIG. 2B illustrates a process of forming the curved shape portion C in a flexible region F of the printed circuit board 100A. The curved portion C may be formed by heating and pressing a mold 300 having a shape corresponding to a shape of the printed circuit board 100A and a shape of the curved portion C of the printed circuit board 100A.

FIG. 2C illustrates a printed circuit board 100A after the curved portion C is formed.

Figure 3:
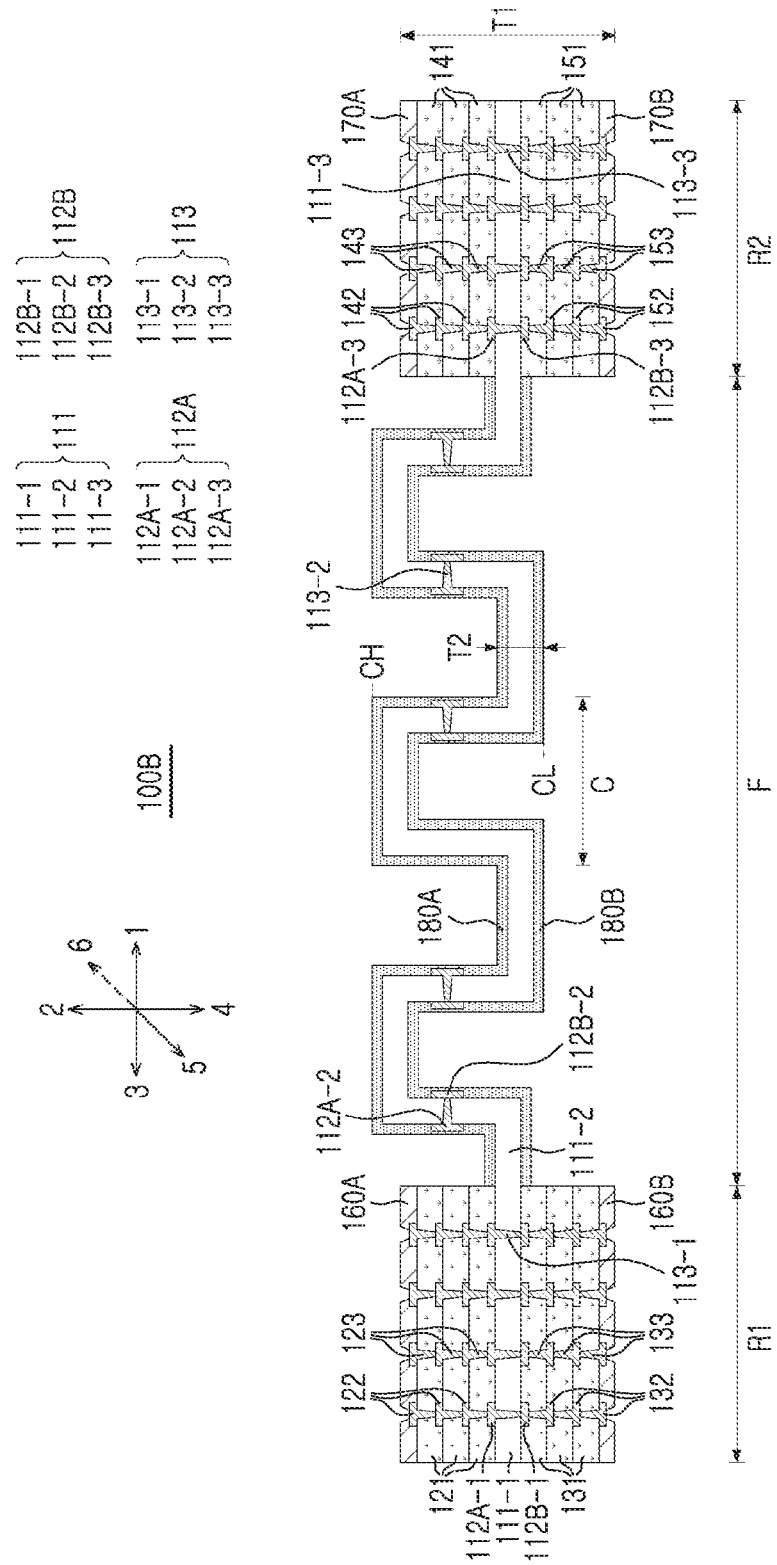
FIG. 3 is a schematic cross-sectional view of a printed circuit board according to another example.

FIG. 3 is a schematic cross-sectional view of a printed circuit board 100B according to another example.

Figure 4:
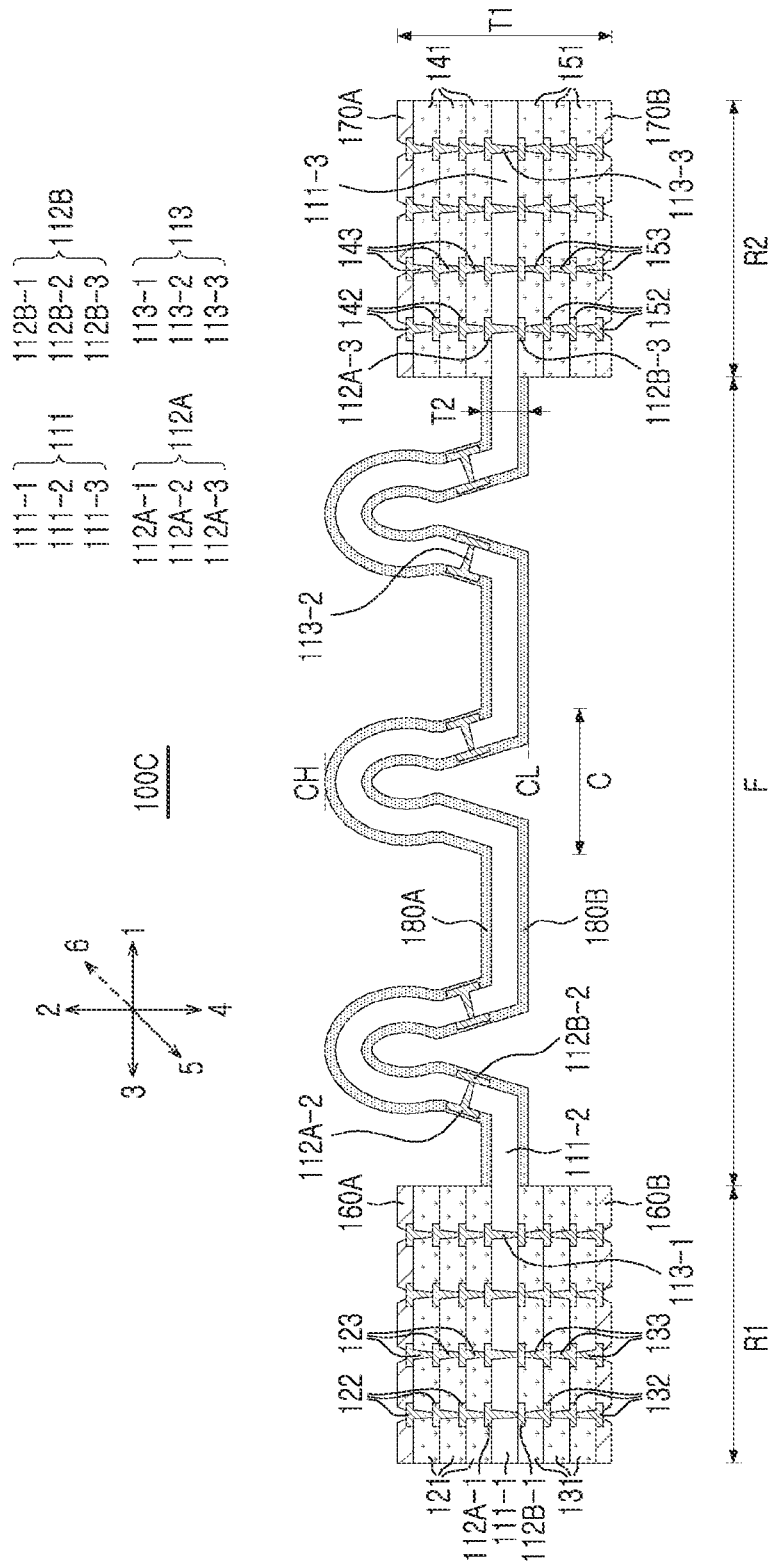
FIG. 4 is a schematic cross-sectional view of a printed circuit board according to another example.

FIG. 4 is a schematic cross-sectional view of a printed circuit board 100C according to a further example.

Referring to FIGS. 3 and 4, each of the printed circuit boards 100B and 100C has a curved portion C having a shape different from the shape of the curved portion C of the printed circuit board 100A.

However, each of the printed circuit board 100B and 100C according to other examples illustratively shows that the curved shape C may have various shapes, and the shape of the curved shape C is not intended to be limited to the shape of the curved portion of the printed circuit board 100A according to the example of FIG. 1 and may instead have other shapes including the shapes of the curved portion of each of the printed circuit boards 100B and 100C. For example, a curved portion C of a printed circuit board of this application may have a semicircular shape having a curved portion in a third direction or a fourth direction, and may have a shape in which a semicircular shape having a bent portion, bent in the third direction and a semicircular shape having a bent portion, bent in the fourth direction are alternately disposed.

Other descriptions of the printed circuit boards 100B and 100C are substantially the same as those given in the printed circuit board 100A, and thus will be omitted.

Figure 5:
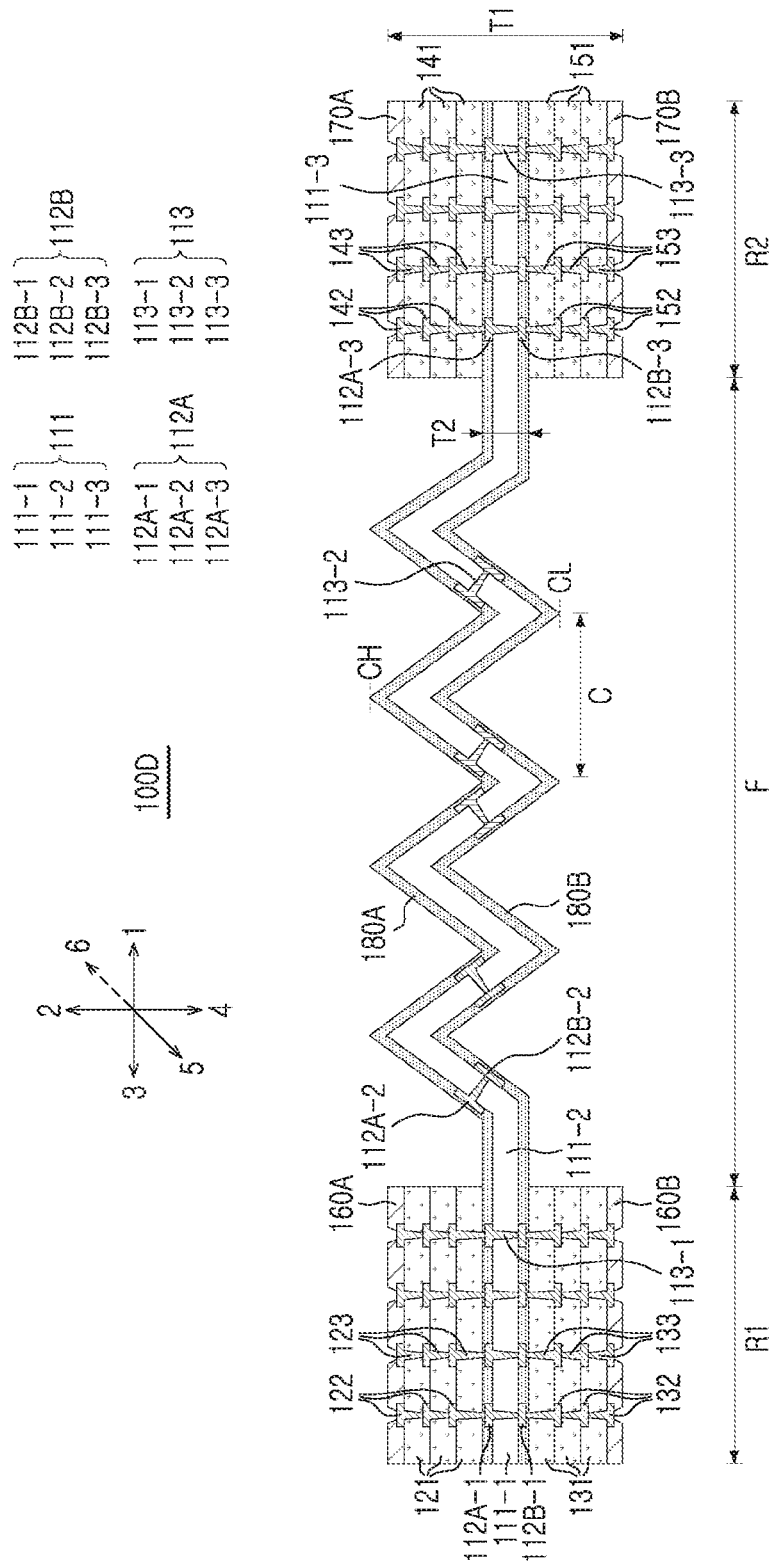
FIG. 5 is a schematic cross-sectional view of a printed circuit board according to another example.

FIG. 5 is a schematic cross-sectional view of a printed circuit board 100D according to another example.

Referring to FIG. 5, unlike the printed circuit board 100A, the printed circuit board 100D includes a first coverlay layer 180A and a second coverlay layer 180B, each extending to the first rigid region R1 and the second rigid region R2.

Therefore, the first coverlay layer 180A further covers a first region 112A-1 and a third region 112A-3 of the first wiring layer 112A, and the second coverlay layer 180B further covers a first region 112B-1 and a third region 112B-3 of a second wiring layer 112B.

A second insulating layer 121 and a fourth insulating layer 141 are each disposed on the first coverlay layer 180A, and a third insulating layer 131 and a fifth insulating layer 151 are each disposed on the second coverlay layer 180B.

As a result, a portion of a plurality of second vias 123 penetrate through the second insulating layer 121 to further penetrate through the first coverlay layer 180A, and a portion of a plurality of fourth vias 143 may penetrate through the fourth insulating layer 141 to further penetrate through the first coverlay layer 180A. In addition, a portion of a plurality of third vias 133 penetrate through the third insulating layer 131 to further penetrate through the second coverlay layer 180B, and a portion of a plurality of fifth vias 153 penetrate through the fifth insulating layer 151 to further penetrate through the second coverlay layer 180B.

The other descriptions are substantially the same as those given in the printed circuit board 100A according to an example, and thus will be omitted.

Figure 6:
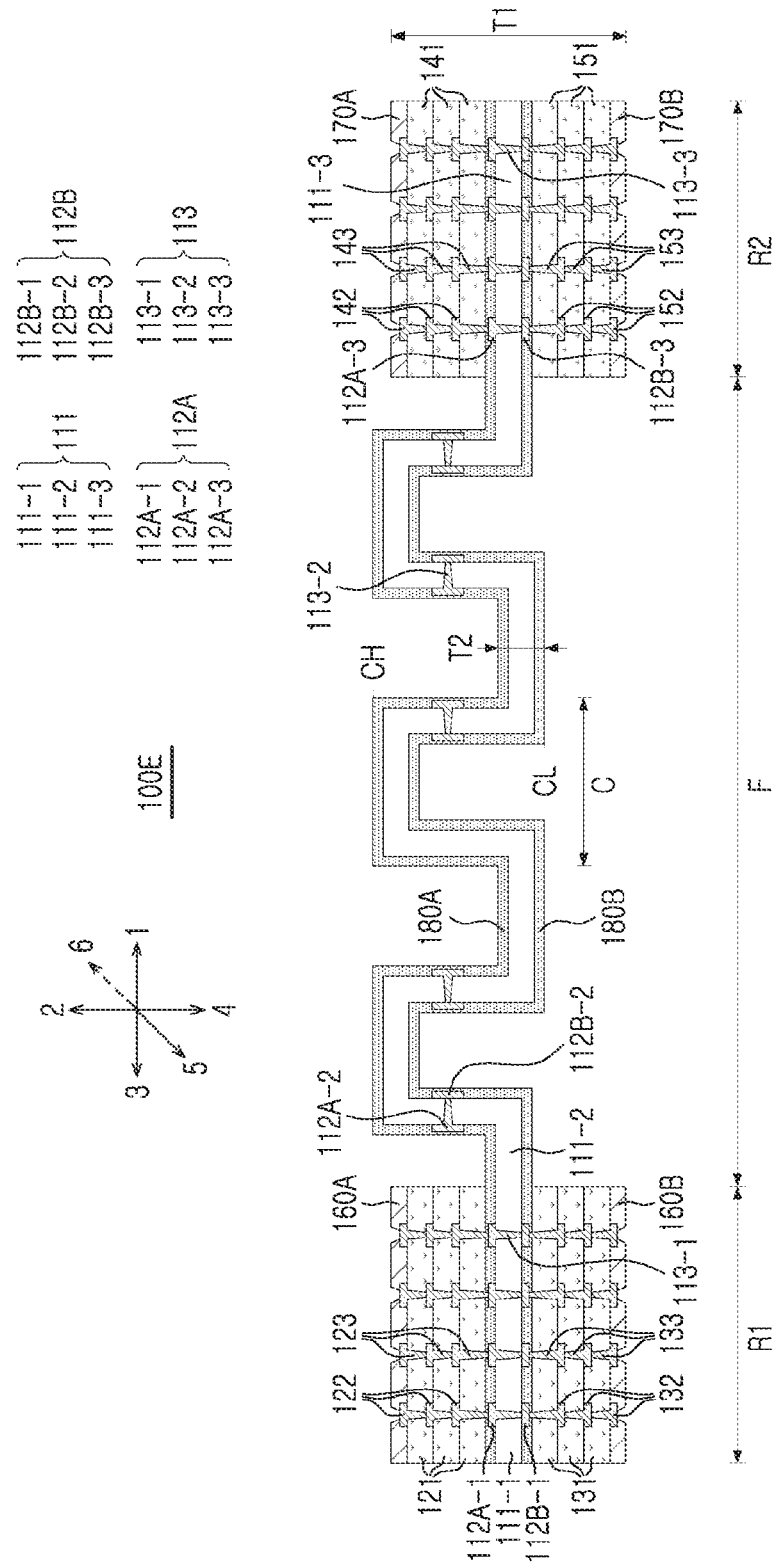
FIG. 6 is a schematic cross-sectional view of a printed circuit board according to another example.

FIG. 6 is a schematic cross-sectional view of a printed circuit board 100E according to another example.

Figure 7:
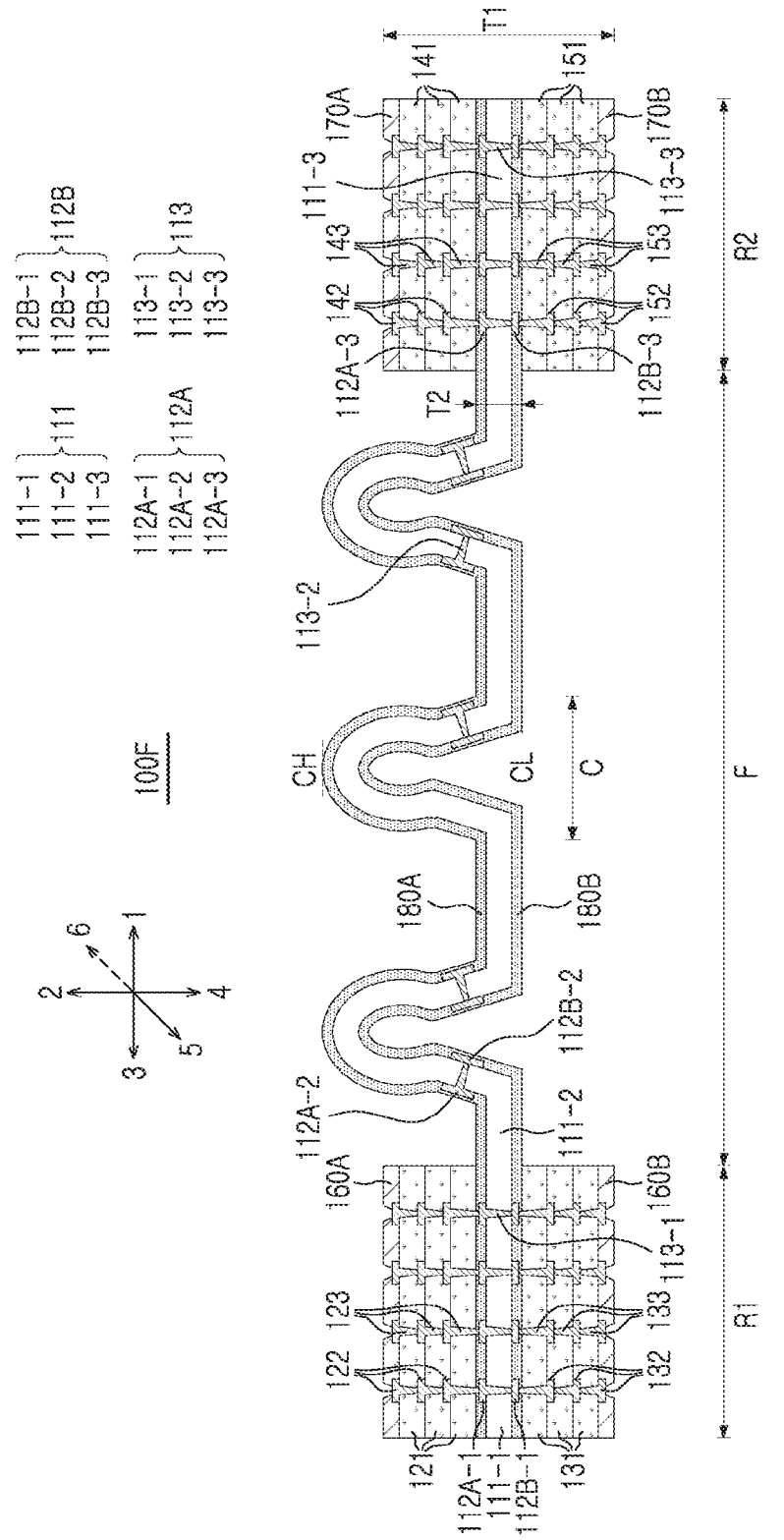
FIG. 7 is a schematic cross-sectional view of a printed circuit board according to another example.

FIG. 7 is a schematic cross-sectional view of a printed circuit board 100F according to further example.

Referring to FIGS. 6 and 7, each of the printed circuit boards 100E and 100F according to an example has a curved portion C having a shape different from the shape of the curved portion C of the printed circuit board 100D.

However, each of the printed circuit board 100E and 100F according to another example illustratively shows that the curved shape C may have various shapes, and the shape of the curved shape C is not intended to be limited to the shape of the curved portion of the printed circuit board 100D according to an example and the shape of the curved portion of each of the printed circuit boards 100E and 100F according to another example.

The other descriptions are substantially the same as those given in the printed circuit board 100A according to an example, and thus will be omitted.

Figure 8:
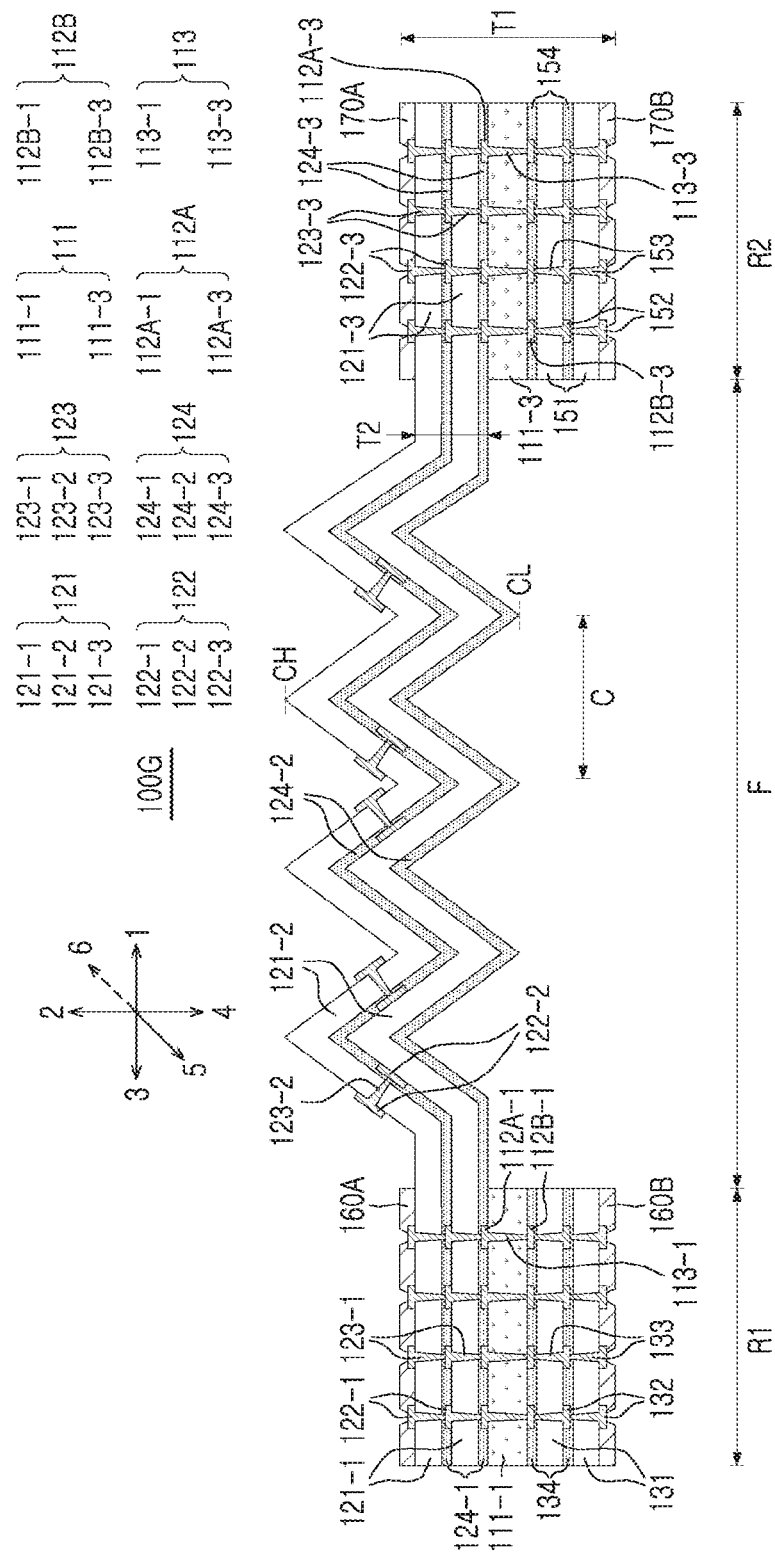
FIG. 8 is a schematic cross-sectional view of a printed circuit board according to another example.

FIG. 8 is a schematic cross-sectional view of a printed circuit board 100G according to another example.

Referring to FIG. 8, unlike the printed circuit board 100A, a printed circuit board 100G includes a first insulating layer 111, a second wiring layer 112A, a first region 111-1 in which the first insulating layer 111 is disposed in a first rigid region R1, and a third region 111-3 in which the first insulating layer 111 is disposed in a second rigid region R2, but does not include a second region of first insulating layer 111 disposed in a flexible region F.

In addition, unlike the printed circuit board 100A, the printed circuit board 100G has a first region 121-1 in which a second insulating layer 121 is disposed in a first rigid region R1, a second region 121-2 in which the second insulating layer 121 is disposed in a flexible region F, and a third region 121-3 in which the second insulating layer 121 is disposed in a second rigid region R2. In addition, the printed circuit board 100G has a first region 122-1 in which a second wiring layer 122 is disposed in the first rigid region R1, a second region 122-2 in which the second wiring layer 122 is disposed in a flexible region F, and a third region 122-3 in which the second wiring layer 122 is disposed in the second rigid region R2, and has a first region 123-1 in which a third via 123 is disposed in the first rigid region R1, a second region 123-2 in which the third via 123 is disposed in the flexible region F, and a third region 123-3 in which the third via 123 is disposed in the second rigid region R2.

The printed circuit board 100G further includes a plurality of first bonding layers 124, respectively disposed between the first insulating layer 111 and each of the second insulating layers 121 disposed on different layers, and covering a first wiring layer 112A and each of a plurality of third wiring layers 122. The plurality of first bonding layers 124 have a first region 124-1 in the first rigid region R1, a second region 124-2 in the flexible region F, and a third region 124-3 in the second rigid region R2. For example, each of the plurality of first bonding layers 124 is formed to extend to the first rigid region R1, the flexible region F, and the second rigid region R2.

The printed circuit board 100G further includes a plurality of second bonding layers 134, respectively disposed between a first region 111-1 of the first insulating layer 111 and each of third layers 131 disposed on different layers, and covering a first region 112B-1 of a second wiring layer 112B and each of a plurality of fourth wiring layers 132. In addition, the printed circuit board 100G further includes a plurality of third bonding layers 154, respectively disposed between a third region 111-3 of the first insulating layer 111 and each of fifth insulating layers 151 disposed on different layers, and covering a third region 112B-3 of the second wiring layer 112B and a plurality of sixth wiring layers 152.

In the printed circuit board 100G, unlike the printed circuit board 100A, the second insulating layer 121 has a lower modulus of elasticity than a modulus of elasticity of the first insulating layer 111. For example, the second insulating layer 121 may be formed of a material relatively more flexible than a material of the first insulating layer 111. Accordingly, the second insulating layer 121 may be more easily bendable or foldable than the first insulating layer 111.

For example, a material of the second insulating layer 121 may be polyimide (PI), polyethylene terephthalate (PET), polyethylene naphthalate (PEN), polycarbonate (PC), polyethersulfone (PES), polyacrylate (PAR), liquid crystal polymer (LCP), and the like. In addition, the second insulating layer 121 may not include a reinforcing material such as a glass fiber (glass cloth and glass fabric), or the like.

The second insulating layer 121 may include a material having a low dielectric dissipation factor Df. For example, the second insulating layer 121 may include at least one of the above-described liquid crystal polymer (LCP), polyimide (PI), cyclo olefin polymer (COP), polyphenylene ether (PPE), polyether ether ketone (PEEK), and polytetrafluoroethylene (PTFE), or a derivative thereof.

When the second insulating layer 121 includes a material having a low dielectric dissipation factor Df, signal transmission loss in a radio-frequency region may be more effectively reduced and the second insulating layer 121 may be efficiently used as a board for mounting a chip antenna and/or a wireless communications chip.

Unlike the printed circuit board 100A, the first insulating layer 111 in the printed circuit board 100G has a relatively higher modulus of elasticity than the second insulating layer 121. For example, the first insulating layer 111 may be formed of a relatively more rigid material than the second insulating layer 121. Therefore, the first insulating layer 111 may be more difficult to be bent or folded than the second insulating layer 121.

For example, a material of the first insulating layer 111 in the printed circuit board 100G may be a thermosetting resin such as an epoxy resin, a thermoplastic resin such as a polyimide resin, an insulating material in which the thermosetting resin or the thermoplastic resin is impregnated in a core material, such as an inorganic filler and/or a glass fiber (or a glass cloth or a glass fabric), such as prepreg, Ajinomoto build-up film (ABF), FR-4, Bismaleimide Triazine (BT), or the like. As appropriate, the material of the second insulating layer 121 may include a photoimageable dielectric (PID) resin.

The first bonding layer 124 may also have a relatively lower modulus of elasticity than the first insulating layer 111. For example, the first bonding layer 124 may be formed of a relatively more flexible material than the first insulating layer 111. Therefore, the first bonding layer 124 may be more easily bent or folded than the first insulating layer 111. For example, the first bonding layer 124 may be a bonding sheet, but is not limited thereto. As another example, the first bonding layer 124 may include at least one of an epoxy resin, polyphenylene ether (PPE), and cyclo olefin polymer (COP), each having a low dielectric dissipation factor Df, or a derivative thereof. In addition, the first bonding layer 124 may have a thickness less than a thickness of the second insulating layer 121.

When the first bonding layer 124 includes a material having a low dielectric dissipation factor Df, signal transmission loss in a radio-frequency region may be effectively reduced and the first bonding layer 124 may be efficiently used as a board for mounting a chip antenna and/or a wireless communications chip.

Accordingly, the printed circuit board 100G may be bent and/or folded by the second insulating layer 121 and the first bonding layer 124 in the flexible region F. This is because the flexible region F does not include the first insulating layer 111 having a higher modulus of elasticity than the second insulating layer 121 and the first bonding layer 124.

Each of the third insulating layer 131 and the fifth insulating layer 151 may have a relatively higher or lower modulus of elasticity than the first insulating layer 111 or the second insulating layer 121. Each of the third insulating layer 131 and the fifth insulating layer 151 may have substantially the same modulus of elasticity as the first insulating layer 111 or the second insulating layer 121. For example, a material of each of third insulating layer 131 and the fifth insulating layer 151 may the same as a material of the second insulating layer 121.

Each of the second bonding layer 134 and the third bonding layer 154 may be a bonding sheet, but is not limited thereto, and may be formed of an insulating material. A material of each of the second bonding layer 134 and the third bonding layer 154 may be the same as a material of the first bonding material 124. In addition, each of the second and third bonding layers 134 and 154 may have a thickness smaller than each of the third and fifth insulating layers 131 and 151.

Figure 9:
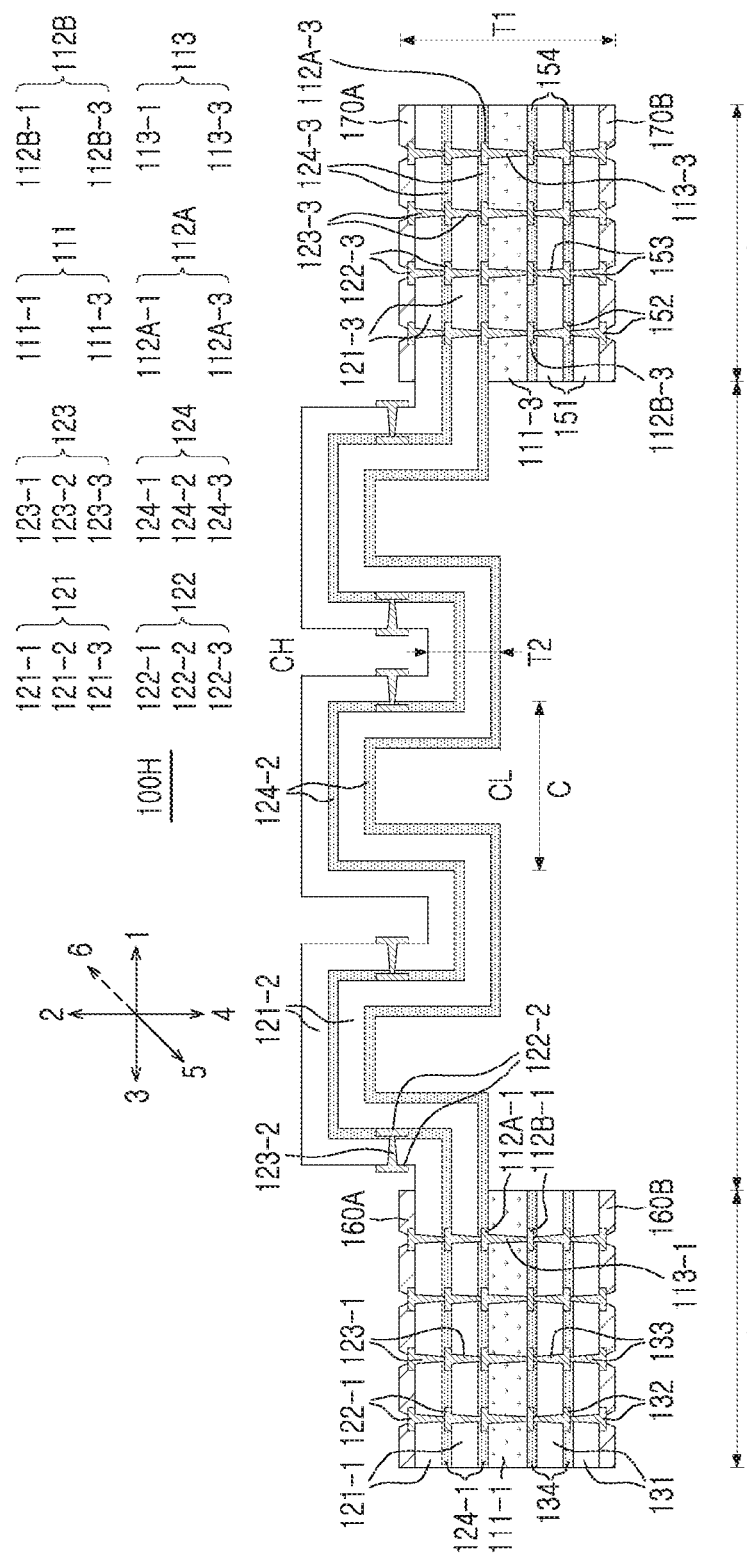
FIG. 9 is a schematic cross-sectional view of a printed circuit board according to another example.

FIG. 9 is a schematic cross-sectional view of a printed circuit board 100H according to another example.

Figure 10:
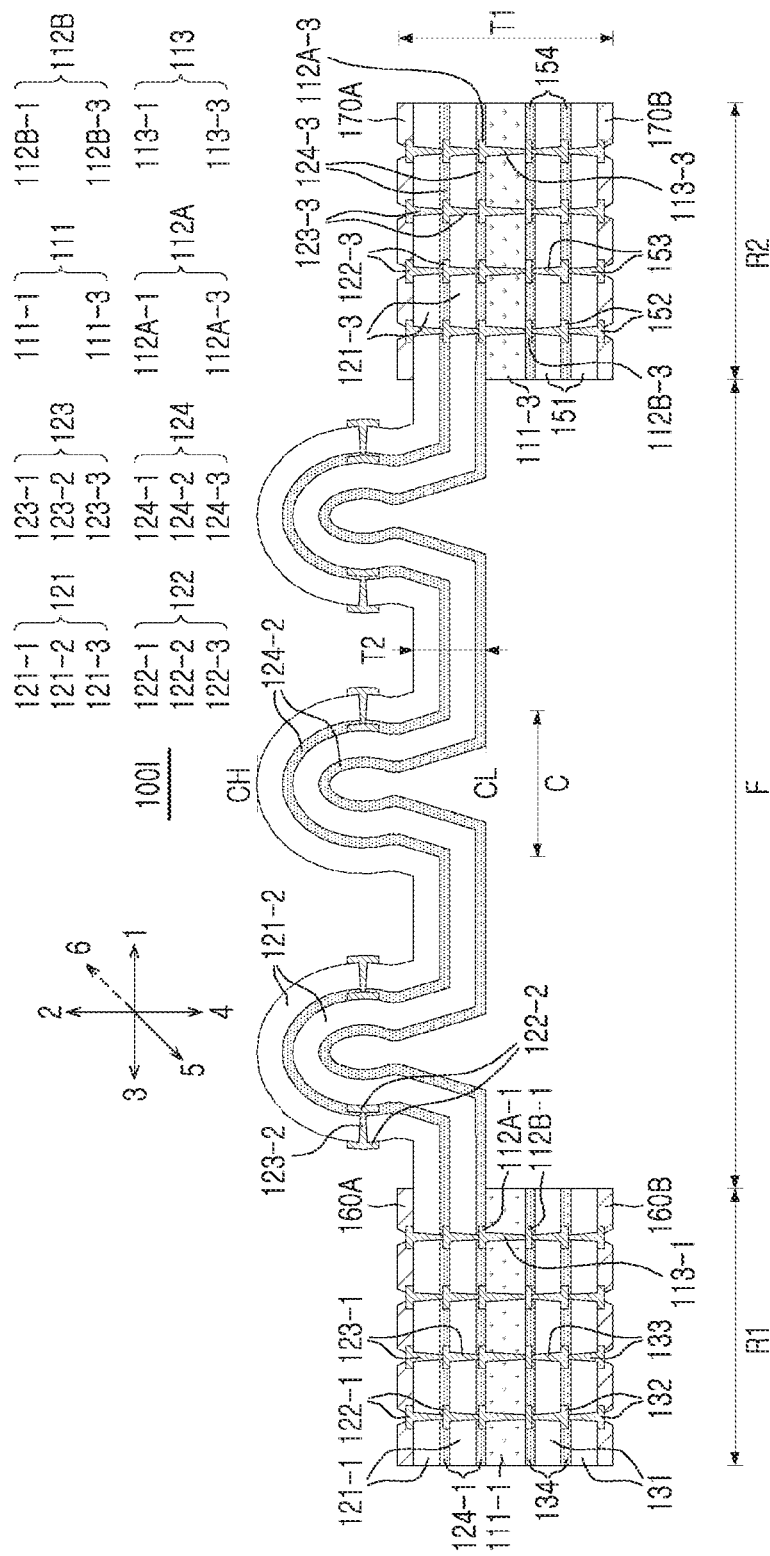
FIG. 10 is a schematic cross-sectional view of a printed circuit board according to another example.

FIG. 10 is a schematic cross-sectional view of a printed circuit board 100I according to another example.

Referring to the FIGS. 9 and 10, each of the printed circuit board 100H and 100I has a curved portion C having a shape different from the shape of the curved portion of the printed circuit board 100G.

However, each of the printed circuit boards 100H and 100I illustratively shows that the curved shape C may have various shapes, and the shape of the curved shape C is not intended to be limited to the particular shapes of the curved portions of the printed circuit boards 100G, 100H, and 100I.

The other descriptions are substantially the same as those given in the printed circuit board 100G according to an example, and thus will be omitted.

Figure 11:
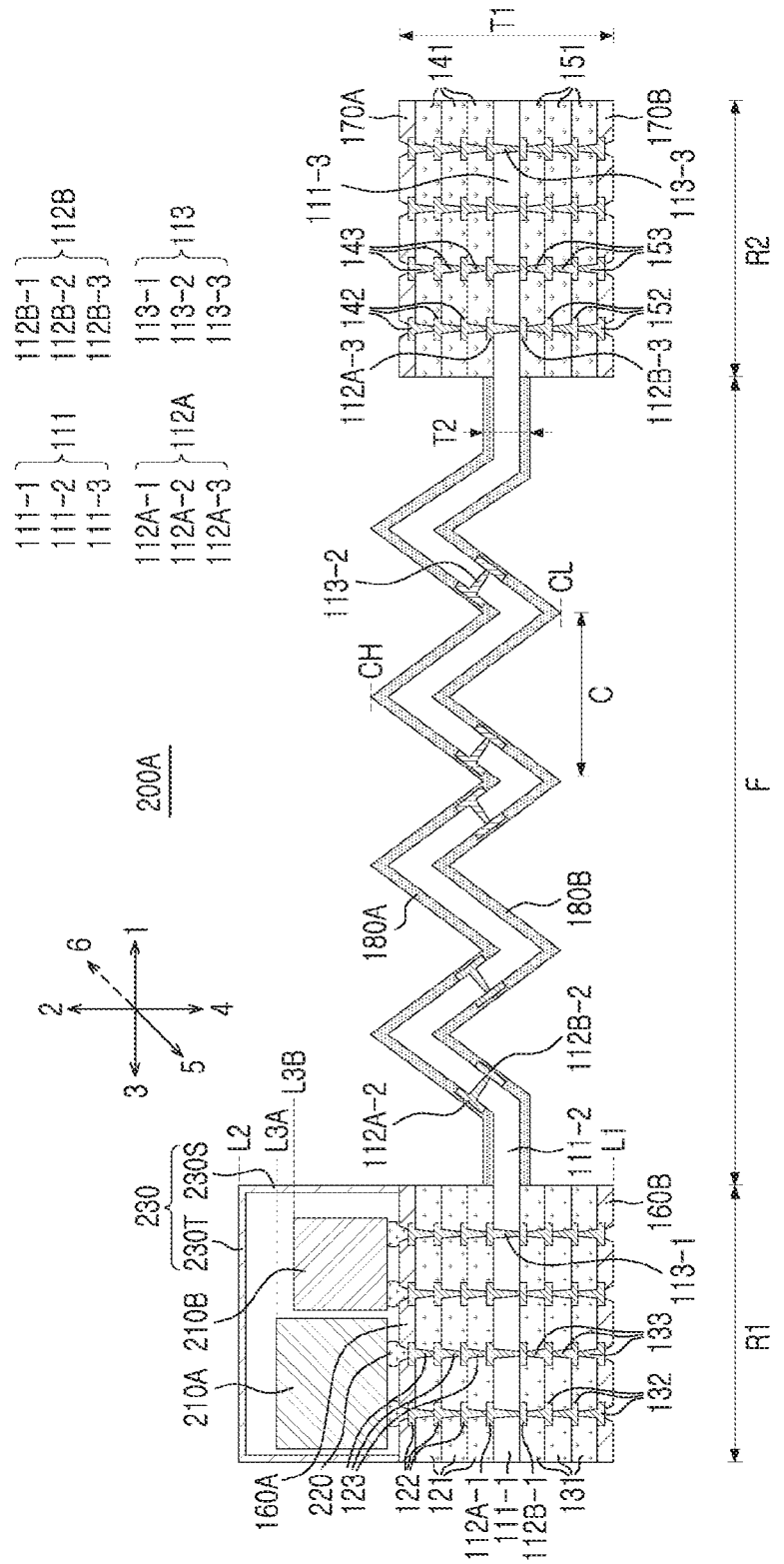
FIG. 11 is a schematic cross-sectional view of an electronic component module according to an example.

FIG. 11 is a schematic cross-sectional view of an electronic component module 200A according to an example.

The electronic component module 200A may include a first printed circuit board 100A, and a first electronic component 210A and a second electronic component 210B disposed on a first rigid region R1 of the printed circuit board to be spaced apart from each other.

The first electronic component 210A and the second electronic component 210B may be mounted on the printed circuit board 100A through a connection conductor 220. For example, each of the first electronic component 210A and the second electronic component 210B may be connected to a third wiring layer 122, exposed through a first passivation layer 160A, through one or more connection conductor(s) 220.

The electronic component module 200A may further include a shielding member 230 surrounding at least a portion of each of the first electronic component 210A and the second electronic component 210B.

In FIG. 11, the first electronic component 210A and the second electronic component 210B are illustrated as being disposed only on one side of the first rigid region R1 of the printed circuit board 100A, but dispositions of the first and second electronic components 210A and 210B are not limited thereto. In addition, the electronic component module 200A may include a greater number of electronic components than illustrated in the drawings, and may include a smaller number of electronic components than illustrated in the drawing. For example, the number, dispositions, and the like, of the electronic components included in the electronic component module 200A may vary depending on a design. For example, one electronic component may be disposed on one side of the first rigid region R1 of the printed circuit board 100A, and two electronic components may be disposed on one side of the second rigid region R2 of the printed circuit board 100A. However, the number, dispositions, and the like, of the electronic components are not limited thereto, and the electronic component may also be disposed on the other side of one or both of the first rigid region R1 and the second rigid region R2, as appropriate.

Each of the first electronic component 210A and the second electronic component 210B may be an active component such as an integrated circuit (IC), or a passive component such as an inductor or a capacitor.

A material of the connection conductor 220 may be, for example, solder. However, the material of the connection conductor 220 is not limited thereto, and may be a conductive material such as copper (Cu), aluminum (Al), silver (Ag), tin (Sn), gold (Au), nickel (Ni), lead (Pb), titanium (Ti), or alloys thereof.

The shielding member 230 may serve to shield electromagnetic interference (EMI) and/or radio-frequency interference (RFI) of the first electronic component 210A and the second electronic component 210B. A material of the shielding member 230 may be, for example, a metal material such as aluminum (Al), an Al-containing alloy, or the like.

The shield member 230 includes at least a pair of side walls 230S and an upper wall 230T connecting each of the side walls 230S. For example, the shielding member 230 includes a pair of side walls 230S, facing each other, and an upper wall 230T connecting the side walls 230S to each other, so that among four side portions of the shielding member 230, two side portions are closed by the sidewall 230 while the other side portions are open. In addition, the shielding member 230 includes two pairs of side walls 230, facing each other, and an upper wall 230T connecting the side walls 230S to each other, so that all of the four sides of the shielding member 230 are closed by sidewall 230S.

Each of a plurality of curved portions C may be disposed on a level between a surface L1, e.g. a surface of the printed circuit board 100A opposing a surface having each of the first and second electronic components 210A and 210B disposed thereon, and an external surface L2 of the upper wall 230T of the shielding member 230. The external surface L2 of the upper wall 230T of the shielding member 230 refers to a surface opposing an internal surface surrounding each of the first electronic component 210A and the second electronic component 210B. As described above, in the first rigid region R1, the curved portion C is disposed on a lower level than the external surface L2 of the upper wall 230T of the shielding member 230, based on a second direction from the surface L1 of the printed circuit board opposing the surface of the printed circuit board facing each of the first and second electronic components 210A and 210B. Thus, an increase in thickness of the electronic component module 200A, caused by introduction of the plurality of curved portions C, may be prevented.

A relative height relationship between each of the plurality of curved portions C and the shielding member 230 may be applied in the case in which the electronic component module 200A is unfolded, for example, in the case of a structure in which a first rigid region R1 and a flexible region F are connected to each other in a first direction. For example, the relative height relationship may not be applied in the case in which the electronic component module 200A is bent or folded.

When the electronic component module 200A does not include the shielding member 230, each of the plurality of bent portion (C) may be disposed on a level between a surface L1, e.g., a surface of the printed circuit board 100A opposing a surface having the first electronic component 210A disposed thereon, and a surface L3A of the first electronic component 210A opposing a surface thereof facing the printed circuit board 100A in the first rigid region R1 and/or on a level between a surface L1, e.g., a surface of the printed circuit board 100A opposing a surface having the second electronic component 210B disposed thereon, and a surface L3B of the second electronic component 210B opposing a surface thereof facing the printed circuit board 100A in the first rigid region R1. Such a disposition relationship may allow an increase in thickness of the electronic component module 200A, caused by introduction of the plurality of curved portions C, to be prevented even when the electronic component module 200A does not include the shielding member 230.

A relative height relationship between each of the plurality of curved portions C and the first electronic component 210A or each of the plurality of curved portions C and the second electronic component 210B may also be applied in the case in which the electronic component module 200A is unfolded, for example, in the case of a structure in which the first rigid region R1 and the flexible region F are connected to each other in the first direction. For example, the relative height relationship may not be applied in the case in which the electronic component module 200A is folded or bent.

The other descriptions are substantially the same as those given in the printed circuit board 100A according to an example, and thus will be omitted.

Figure 12:
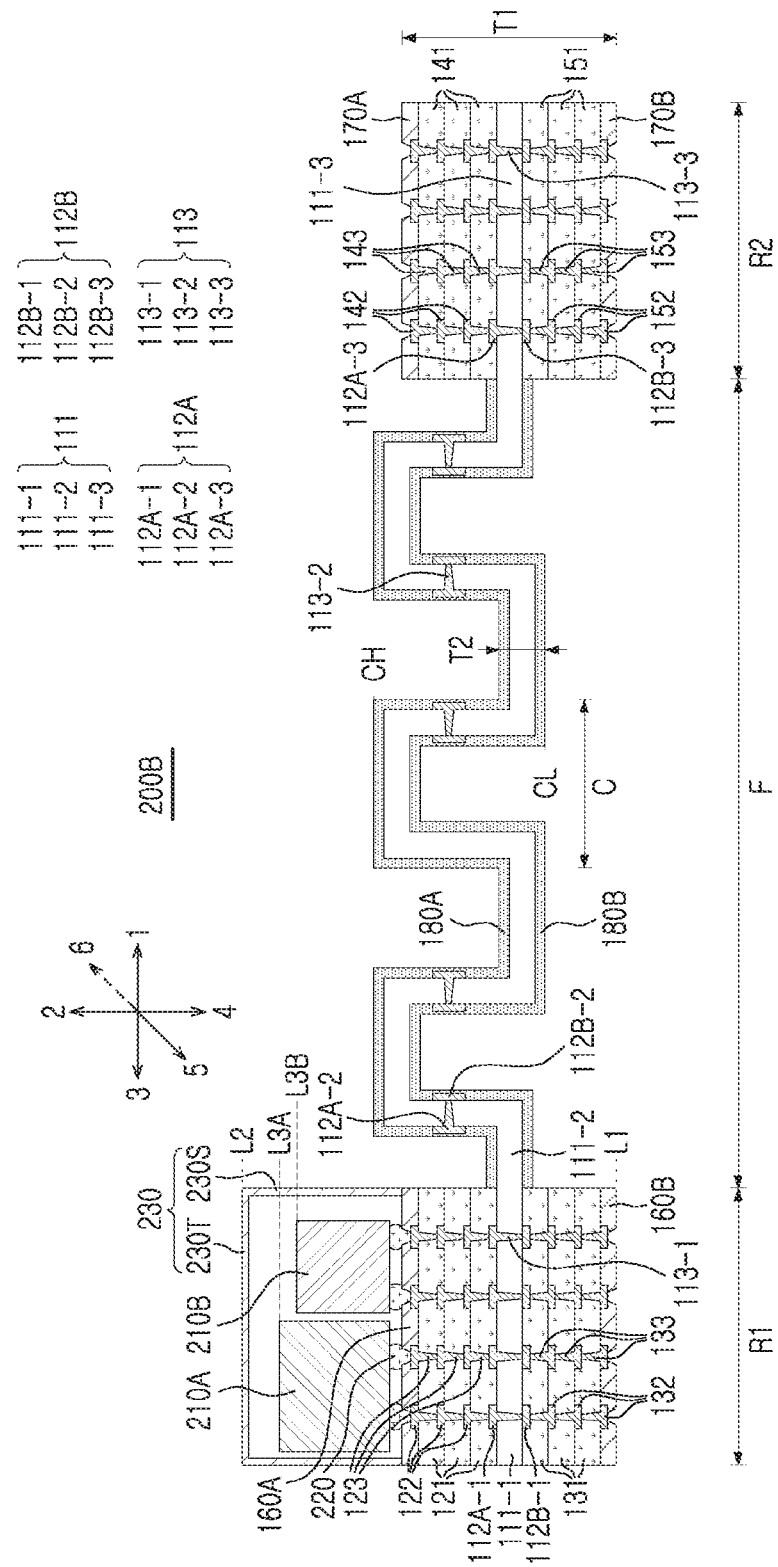
FIG. 12 is a schematic cross-sectional view of an electronic component module according to another example.

FIG. 12 is a schematic cross-sectional view of an electronic component module 200B according to another example.

In the electronic component module 200B according to the other example, a first electronic component 210A and a second electronic component 210B are mounted on the first rigid region R1 of the printed circuit board 100B according to the other example.

The other descriptions are substantially the same as those given in the electronic component module 200A according to an example, and thus will be omitted.

Figure 13:
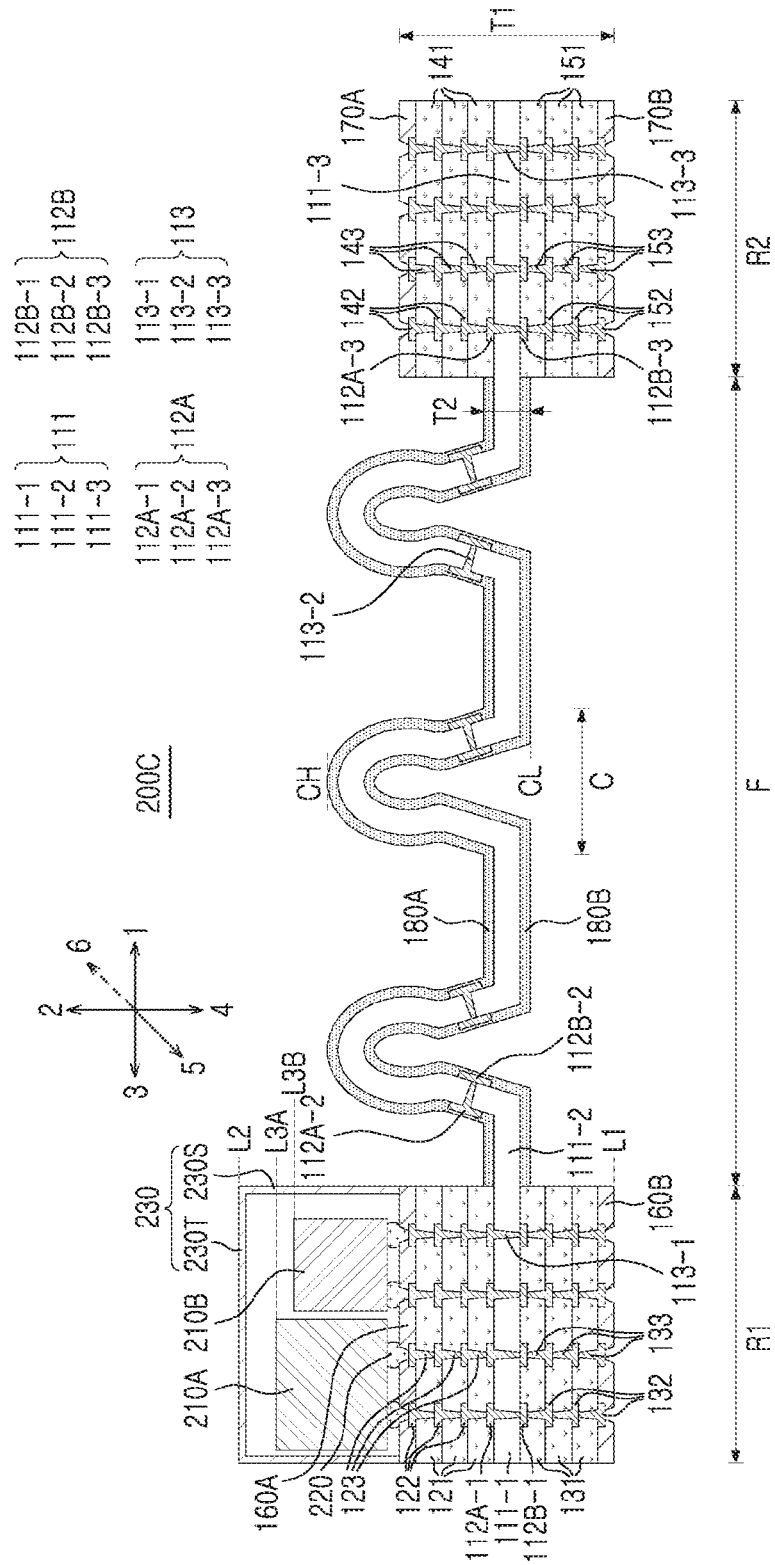
FIG. 13 is a schematic cross-sectional view of an electronic component module according to an example.

FIG. 13 is a schematic cross-sectional view of an electronic component module 200C according to a further example.

In the electronic component module 200C according the other example, a first electronic component 210A and a second electronic component 210B are mounted on the first rigid region R1 of the printed circuit board 100C according to the other example.

The other descriptions are substantially the same as those given in the electronic component module 200A according to an example, and thus will be omitted.

Figure 14:
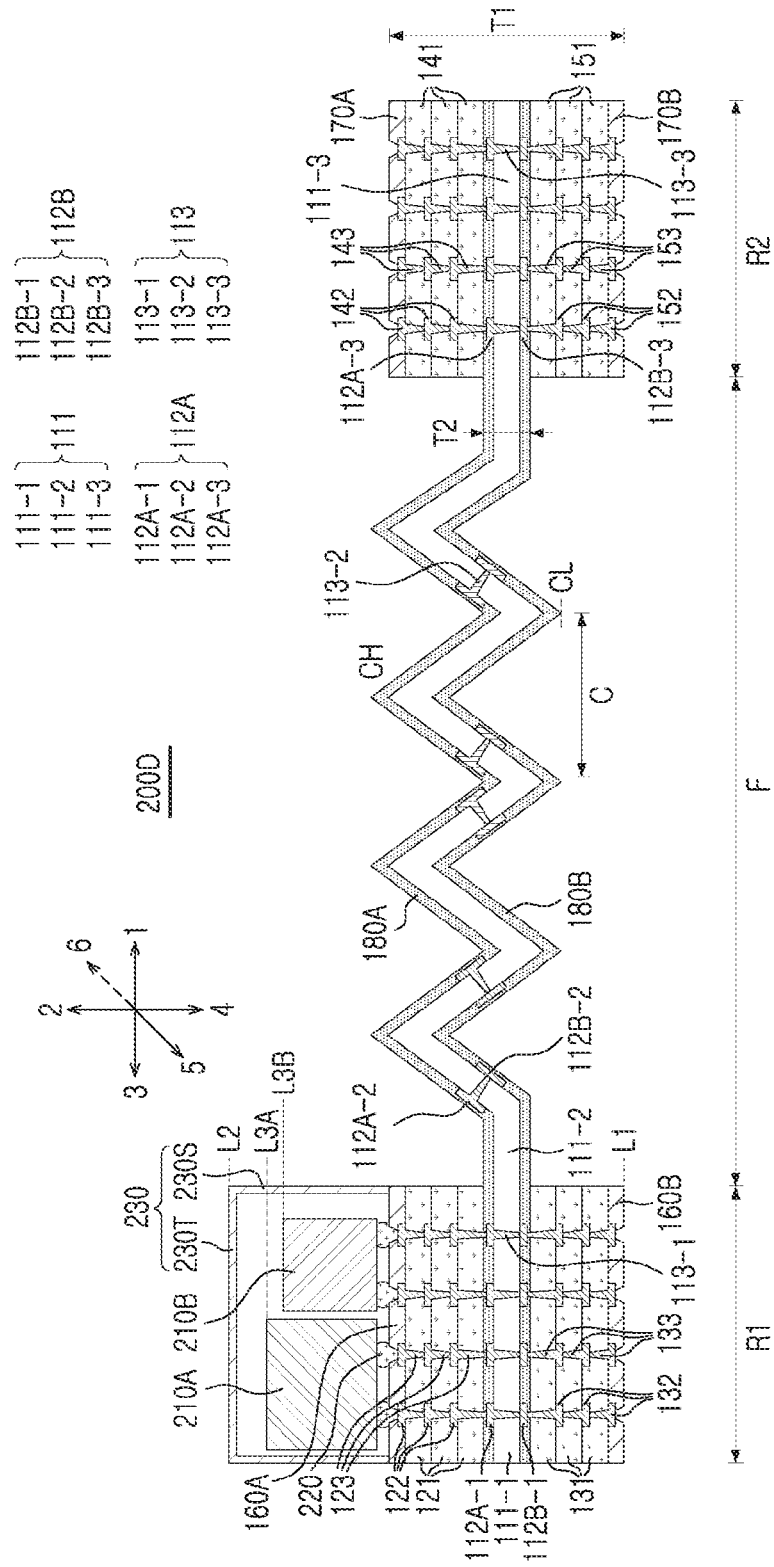
FIG. 14 is a schematic cross-sectional view of an electronic component module according to an example.

FIG. 14 is a schematic cross-sectional view of an electronic component module 200D according to another example.

In the electronic component module 200D according the other example, a first electronic component 210A and a second electronic component 210B are mounted on the first rigid region R1 of the printed circuit board 100D according to the other example.

The other descriptions are substantially the same as those given in the electronic component module 200A according to an example, and thus will be omitted.

Figure 15:
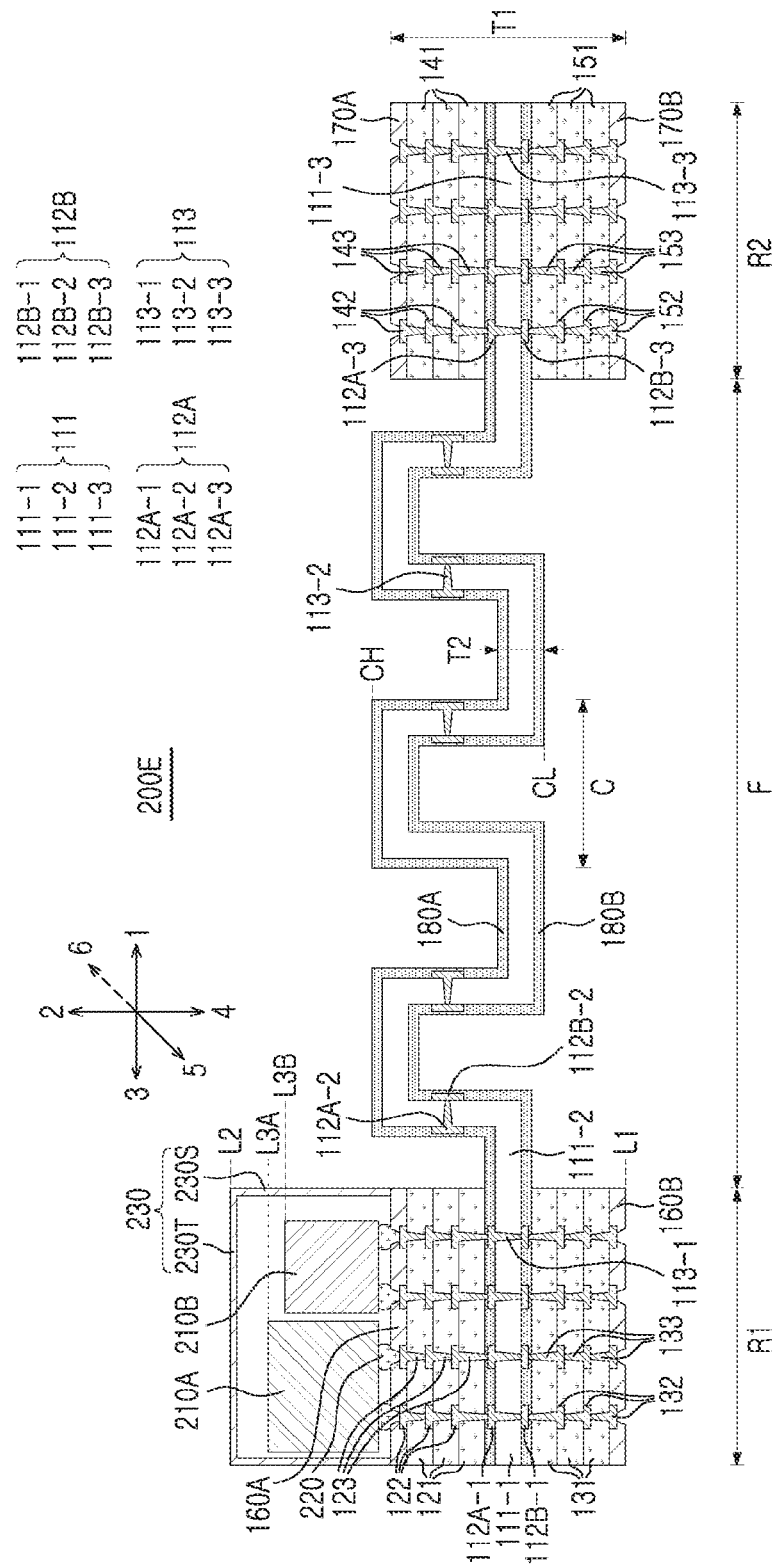
FIG. 15 is a schematic cross-sectional view of an electronic component module according to an example.

FIG. 15 is a schematic cross-sectional view of an electronic component module 200E according to another example.

In the electronic component module 200E according the other example, a first electronic component 210A and a second electronic component 210B are mounted on the first rigid region R1 of the printed circuit board 100E according to the other example.

The other descriptions are substantially the same as those given in the electronic component module 200A according to an example, and thus will be omitted.

Figure 16:
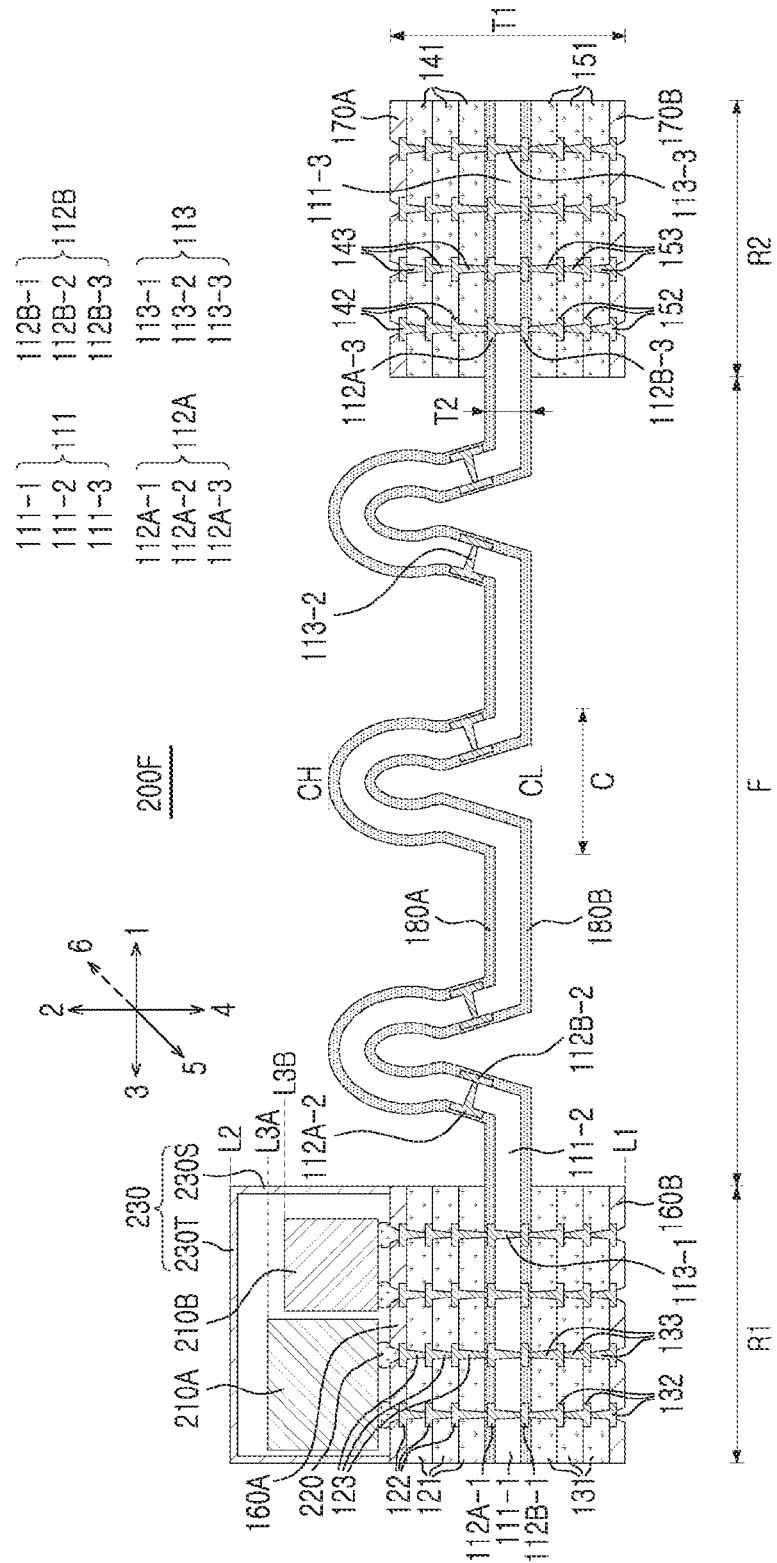
FIG. 16 is a schematic cross-sectional view of an electronic component module according to an example.

FIG. 16 is a schematic cross-sectional view of an electronic component module 200F according to another example.

In the electronic component module 200F according the other example, a first electronic component 210A and a second electronic component 210B are mounted on the first rigid region R1 of the printed circuit board 100F according to another example.

The other descriptions are substantially the same as those given in the electronic component module 200A according to an example, and thus will be omitted.

Figure 17:
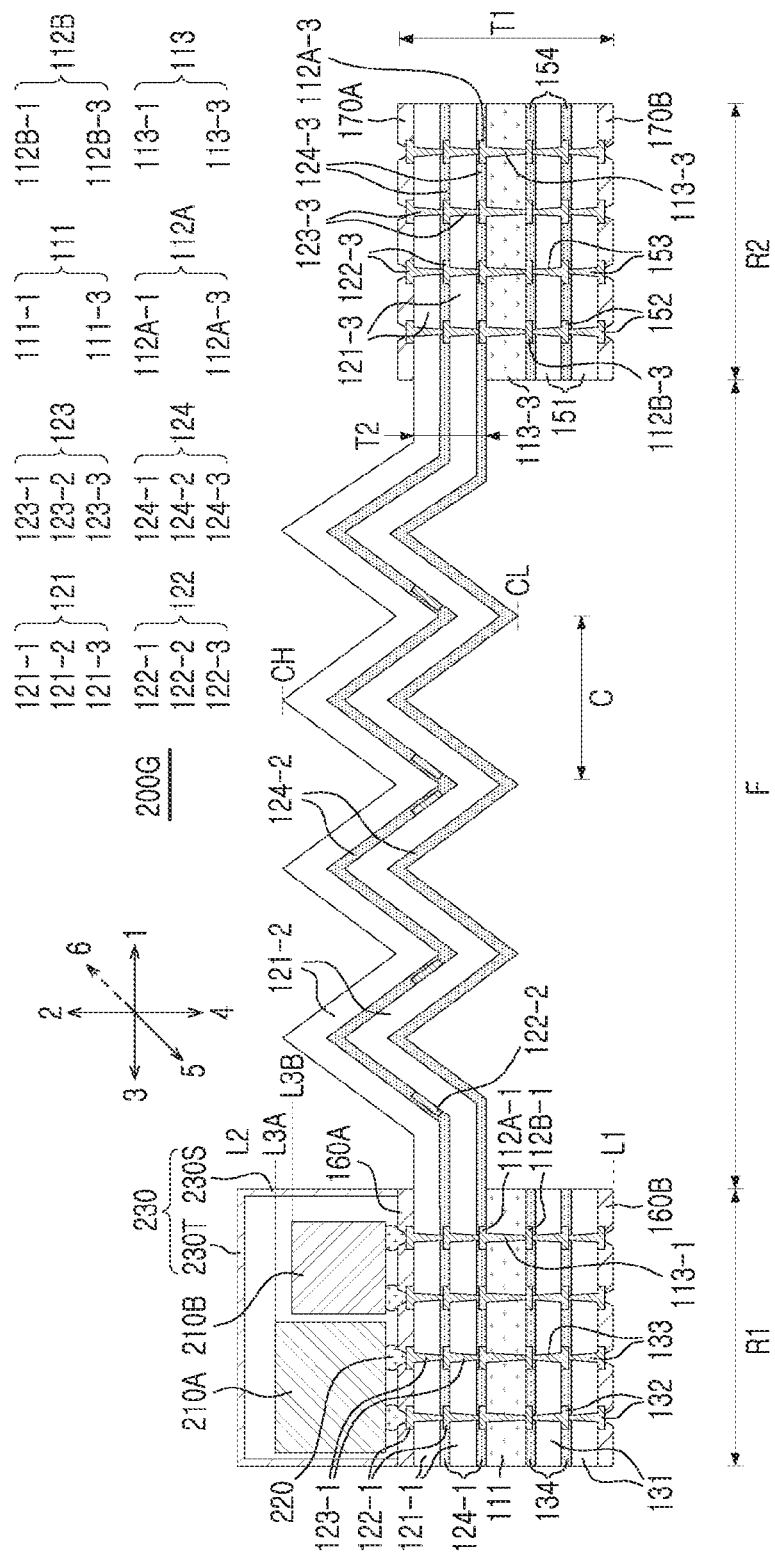
FIG. 17 is a schematic cross-sectional view of an electronic component module according to an example.

FIG. 17 is a schematic cross-sectional view of an electronic component module 200G according to another example.

In the electronic component module 200G according the other example, a first electronic component 210A and a second electronic component 210B are mounted on the first rigid region R1 of the printed circuit board 100G according to the other example.

The other descriptions are substantially the same as those given in the electronic component module 200A according to an example, and thus will be omitted.

Figure 18:
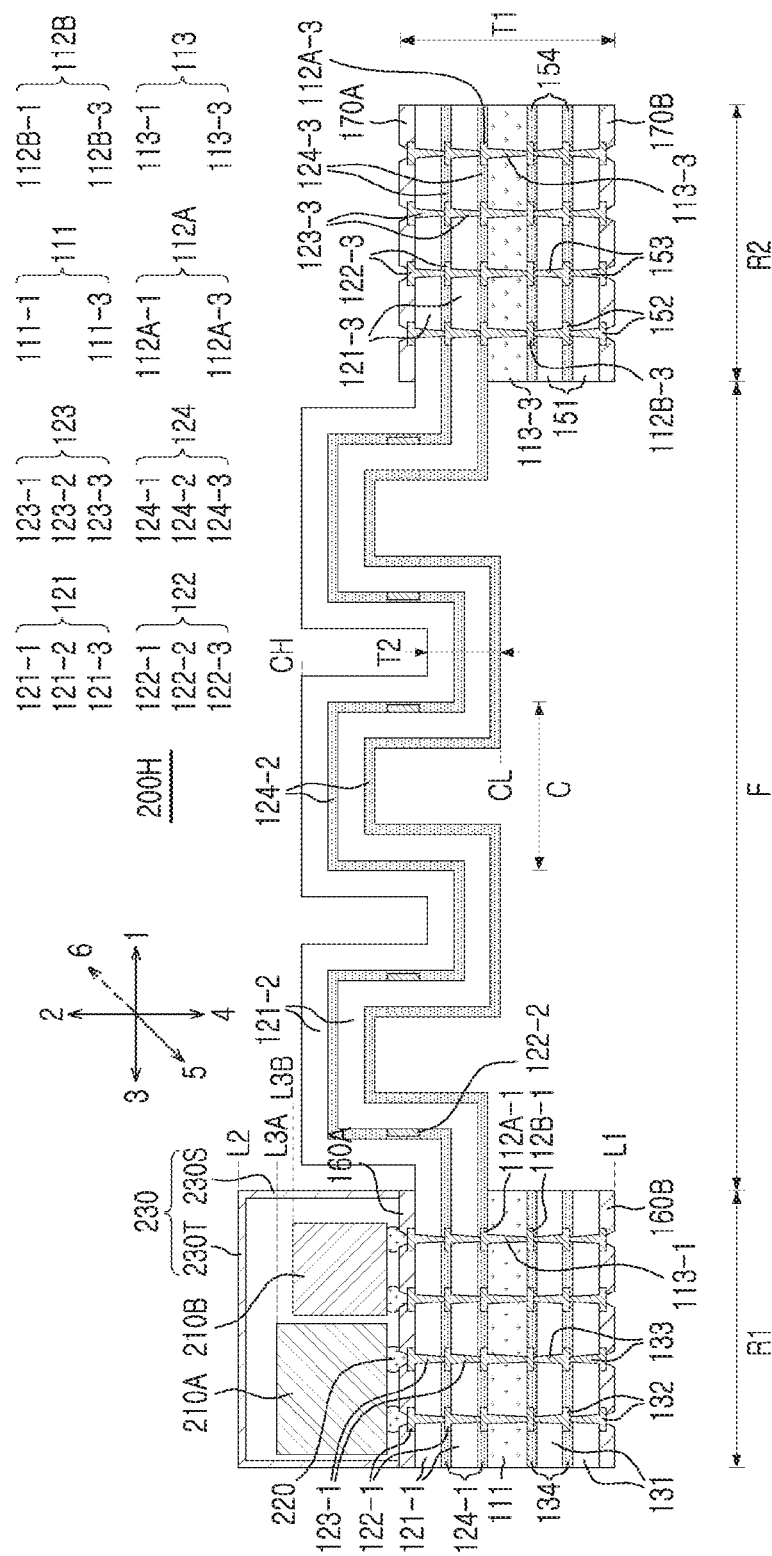
FIG. 18 is a schematic cross-sectional view of an electronic component module according to an example.

FIG. 18 is a schematic cross-sectional view of an electronic component module 200H according to another example.

In the electronic component module 200H according the other example, a first electronic component 210A and a second electronic component 210B are mounted on the first rigid region R1 of the printed circuit board 100H according to the other example.

The other descriptions are substantially the same as those given in the electronic component module 200A according to an example, and thus will be omitted.

Figure 19:
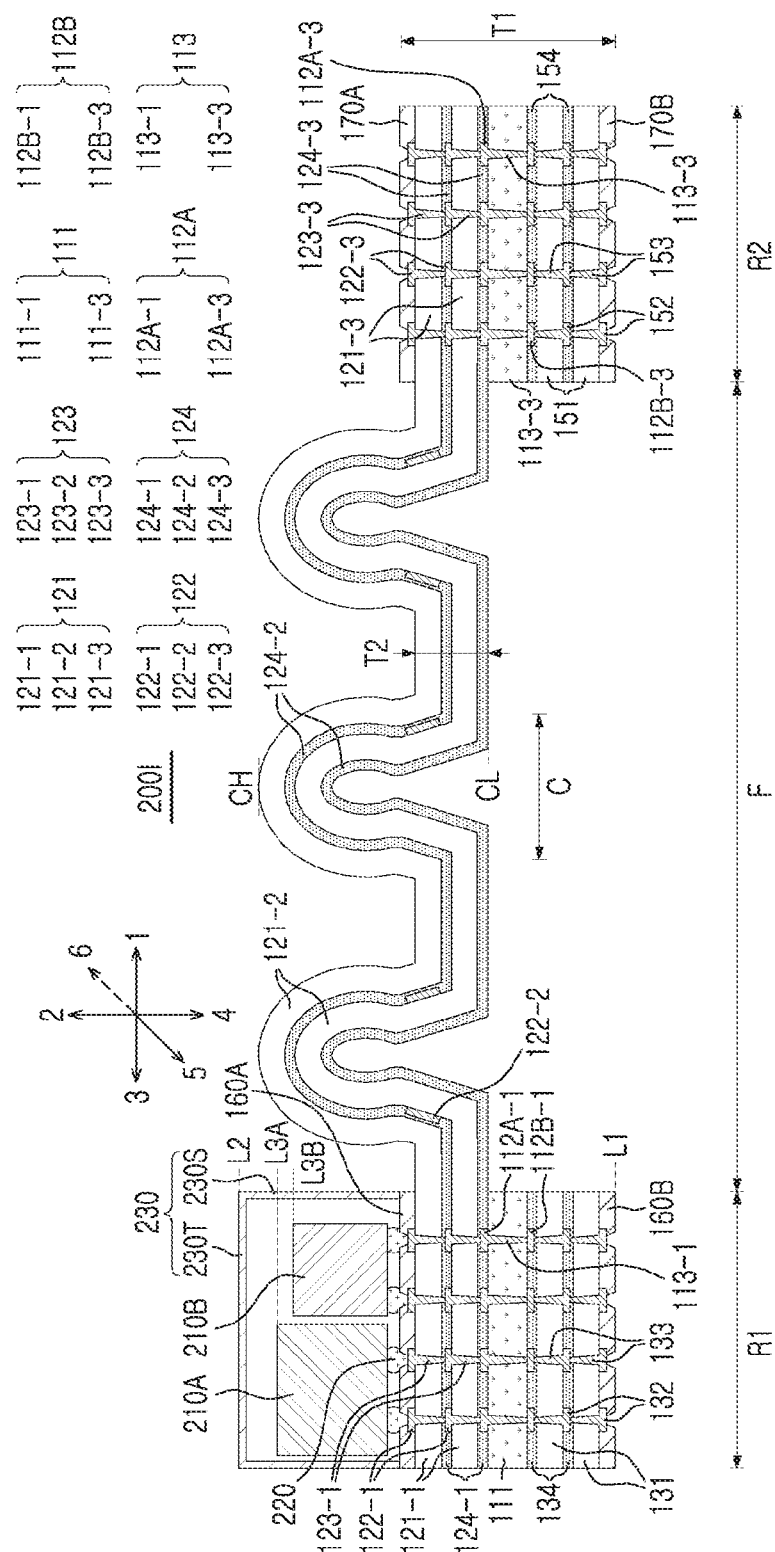
FIG. 19 is a schematic cross-sectional view of an electronic component module according to an example.

FIG. 19 is a schematic cross-sectional view of an electronic component module 200I according to another example.

In the electronic component module 200I according the other example, a first electronic component 210A and a second electronic component 210B are mounted on the first rigid region R1 of the printed circuit board 100I according to the other example.

The other descriptions are substantially the same as those given in the electronic component module 200A according to an example, and thus will be omitted.

FIGS. 20A and 20B are schematic perspective views of an electronic component module in which another element such as a display, or the like, is additionally combined with a printed circuit board 100A or an electronic component module 200A according to an example.

A display 400 is disposed on one side of the printed circuit board 100A. The display 400 is also disposed on a first rigid region R1, a flexible region F, and a second rigid region R2 of the printed circuit board 100A. In this case, the display 400 may be disposed on a side of the printed circuit board 100A opposing the side on which the first electronic component 210A and the second electronic component 210B are disposed.

The display 400 may be a display in which a region corresponding to the flexible region F of the printed circuit board 100A is foldable. However, the display 400 is provided for ease of description and an element, which may be disposed on one side of the printed circuit board 100, is not limited to the display 400.

FIG. 20A illustrates a structure in which the printed circuit board 100A and the display 400 are folded together. In this case, the flexible region F of the printed circuit board 100A includes a plurality of curved portions C, as described above.

FIG. 20B illustrates a structure in which the printed circuit board 100A and the display 400 are unfolded together. As illustrated in the drawing, a height of a protrusion, formed in a central portion of the flexible region F of the printed circuit board 100A, may be reduced to achieve thinning of the printed circuit board 100A. For example, the plurality of curved portions C having elasticity and flexibility may be relaxed and contracted as the printed circuit board 100A is folded and unfolded.

In FIGS. 20A and 20B, a relative height or level with the above-described curved portion C and the above-described electronic components 210A and 210B or the above-described shielding member 230, mounted on the printed circuit board 100A, is negligible to emphasize a shape of a plurality of curved portions C in a structure in which the printed circuit board 100A is folded and unfolded.

As set forth above, a rigid-flexible printed circuit board, which may be thinned while being bendable and/or foldable, may be provided.

In addition, an electronic component module, which may be thinned, may be provided.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items. It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another member, component, region, layer or section. Thus, a first member, component, region, layer or section discussed below could be termed a second member, component, region, layer or section without departing from the teachings of the exemplary embodiments.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

While exemplary embodiments have been shown and described above, it will be apparent to those skilled in the art that modifications and variations could be made without departing from the scope of the present invention as defined by the appended claims.

What is claimed is:

1. A printed circuit board comprising:
    a first rigid region extending in a plane; and
    a flexible region, connected to the first rigid region and adjacent thereto in a first direction,
    wherein the first rigid region has a thickness extending in a second direction, perpendicular to the first direction and perpendicular to the plane, greater than a thickness extending in the second direction of the flexible region, and
    the flexible region has a plurality of curved portions extending in the second direction.

2. The printed circuit board of claim 1, wherein the plurality of curved portions extend between a highest point and a lowest point measured along the second direction, and
    at least one of the highest point and the lowest point is disposed within a region between planes extending in the first direction and disposed along surfaces of the first rigid region opposite each other in the second direction.

3. The printed circuit board of claim 1, further comprising:
    a second rigid region connected to the flexible region and adjacent thereto in the first direction,
    wherein the second rigid region has a thickness greater than the thickness of the flexible region, and
    the flexible region including the plurality of curved portions is disposed between the first rigid region and the second rigid region.

4. The printed circuit board of claim 1, wherein the first rigid region includes a first region of a first insulating layer and a second insulating layer disposed on the first region of the first insulating layer,
    the flexible region includes a second region of the first insulating layer extending from the first region of the first insulating layer in the first direction, and the flexible region is free of the second insulating layer, and
    the second insulating layer has a higher modulus of elasticity than the first insulating layer.

5. The printed circuit board of claim 4, wherein the first insulating layer includes at least one of polyimide, polyethylene terephthalate, polyethylene naphthalate, polycarbonate, polyethersulfone, polyacrylate, and liquid crystal polymer.

6. The printed circuit board of claim 4, wherein the second insulating layer includes a plurality of second insulating layers,
    the first rigid region further includes a first region of a first wiring layer, disposed on the first region of the first insulating layer to be covered with the second insulating layers, and a plurality of second wiring layers, respectively disposed on the plurality of second insulating layers, and
    the flexible region further includes a second region of the first wiring layer disposed on the second region of the first insulating layer, and the flexible region is free of the second wiring layers.

7. The printed circuit board of claim 6, wherein the first rigid region further includes a plurality of third insulating layers, disposed on a side of the first insulating layer opposing a side thereof on which the second insulating layer is disposed, and a plurality of third wiring layers respectively disposed on the plurality of third insulating layers.

8. The printed circuit board of claim 1, wherein the first rigid region includes a first insulating layer, a first wiring layer disposed on the first insulating layer, a first region of a second insulating layer disposed on a side of the first insulating layer on which the first wiring layer is disposed, and a first region of a second wiring layer disposed on the second insulating layer,
    the flexible region includes a second region of the second insulating layer, extending from the first region of the second insulating layer in the first direction, and a second region of the second wiring layer disposed on the second region of the second insulating layer, and
    the first insulating layer has a higher modulus of elasticity than the second insulating layer.

9. The printed circuit board of claim 8, wherein the first rigid region further includes a bonding layer disposed between the first insulating layer and the second insulating layer and covering the first wiring layer.

10. An electronic component module comprising:
    a printed circuit board extending in a plane and having a thickness extending in a second direction, perpendicular to the plane, the printed circuit board including a first rigid region and a flexible region connected to the first rigid region and adjacent thereto in a first direction perpendicular to the second direction; and an electronic component disposed on the first rigid region of the printed circuit board, wherein the flexible region has a plurality of curved portions extending in the second direction.

11. The electronic component module of claim 10, wherein the printed circuit board further includes a second rigid region connected to the flexible region adjacent thereto in the first direction, and the flexible region including the plurality of curved portions is disposed between the first rigid region and the second rigid region.

12. The electronic component module of claim 10, wherein the plurality of curved portions extend between a highest point and a lowest point measured along the second direction, and the highest and lowest points of the curved portions are disposed at levels along the second direction between a surface of the printed circuit board opposing a surface thereof having the electronic component thereon, and a surface of the electronic component opposing a surface thereof facing the printed circuit board.

13. The electronic component module of claim 10, further comprising:

a shielding member disposed on the first rigid region of the printed circuit board and surrounding at least a portion of the electronic component, wherein the shielding member has at least a pair of sidewalls and an upper wall connecting the sidewalls to each other, and the plurality of curved portions extend between a highest point and a lowest point measured along the second direction, and the highest and lowest points of the curved portions are disposed at levels along the second direction between a surface of the printed circuit board opposing a surface thereof having the electronic component thereon, and an external surface of the upper wall of the shielding member in the first rigid region.

14. The electronic component module of claim 10, wherein the electronic component includes a plurality of electronic components spaced apart from each other, and each of the plurality of electronic components includes at least one of an active element or a passive element.

15. The electronic component module of claim 11, further comprising:

a display disposed on the first rigid region, the flexible region, and the second rigid region of the printed circuit board, wherein the display is disposed on a side of the printed circuit opposing a side thereof on which the electronic component is disposed.

16. The electronic component module of claim 15, wherein a region of the display, corresponding to the flexible region of the printed circuit board, is foldable.

17. A printed circuit board comprising:

a first rigid region extending in a plane in a first direction and having a thickness extending in a second direction perpendicular to the first direction and perpendicular to the plane; and a flexible region connected to the first rigid region, having a lower modulus of elasticity than the first rigid region, and adjacent to the first rigid region in the first direction, wherein an insulating layer extends across the first rigid region and the flexible region, and the insulating layer in the first rigid region is planar and the insulating layer in the flexible region extends outside of a plane of the insulating layer in the first rigid region in the second direction.

18. The printed circuit board of claim 17, wherein the first rigid region further comprises a second insulating layer disposed on the insulating layer in the first rigid region and having a higher modulus of elasticity than the insulating layer extending across the first rigid region and the flexible region.

19. The printed circuit board of claim 18, further comprising a coverlay layer covering a surface of the insulating layer in the flexible region, and extending between the insulating layer and the second insulating layer in the first rigid region.

20. The printed circuit board of claim 17, wherein the insulating layer extending across the first rigid region and the flexible region comprises a plurality of insulating layers each extending across the first rigid region and the flexible region, one or more wiring layers disposed between the plurality of insulating layers in the first rigid region and the flexible region, and one or more bonding layers disposed between the plurality of insulating layers in the first rigid region and the flexible region and covering the one or more wiring layers.

21. The printed circuit board of claim 17, wherein the thickness of the first rigid region is greater than a thickness of the flexible region.

22. An electronic component module comprising:

the printed circuit board of claim 17; and an electronic component disposed on the first rigid region of the printed circuit board, wherein the flexible region of the printed circuit board extends outside of a plane of the insulating layer between a highest point and a lowest point measured along the second direction, and the highest and lowest points are disposed at levels along the second direction between a surface of the printed circuit board opposing a surface thereof having the electronic component thereon, and a surface of the electronic component opposing a surface thereof facing the printed circuit board.

23. A printed circuit board comprising:

first and second rigid regions extending in a plane in a first direction and having a thickness extending in a second direction perpendicular to the first direction and perpendicular to the plane, and spaced apart from each other;

a flexible region disposed between the first and second rigid regions and connected to the first and second rigid regions, having a lower modulus of elasticity than the first and second rigid regions, wherein the flexible region is adjacent to the first rigid region in the first direction, and the second rigid region is adjacent to the flexible region in the first direction, and wherein an insulating layer extends across the first rigid region, the flexible region, and the second rigid region, the insulating layer is planar in the first and second rigid regions, and the insulating layer in the flexible region extends outside of a plane of the insulating layer in the first and second rigid regions in the second direction.

24. The printed circuit board of claim 23, wherein each of the first and second rigid regions further comprises a second insulating layer disposed on the insulating layer in the respective first or second rigid region and having a higher modulus of elasticity than the insulating layer extending across the first rigid region, the flexible region, and the second rigid region.

25. The printed circuit board of claim 23, wherein the insulating layer extending across the first rigid region, the flexible region, and the second rigid region comprises a plurality of insulating layers each extending across the first rigid region, the flexible region, and the second rigid region, one or more wiring layers disposed between the plurality of insulating layers in the first rigid region, the flexible region, and the second rigid region, and one or more bonding layers disposed between the plurality of insulating layers in the first rigid region, the flexible region, and the second rigid region and covering the one or more wiring layers.

26. A printed circuit board comprising:
first and second rigid regions extending in a plane in a first direction and having a thickness extending in a second direction perpendicular to the first direction and perpendicular to the plane, and spaced apart from each other;
a flexible region disposed between the first and second rigid regions and connected to the first and second rigid regions,
wherein the flexible region is adjacent to the first rigid region in the first direction, and the second rigid region is adjacent to the flexible region in the first direction, and
wherein an insulating layer extends across the first rigid region, the flexible region, and the second rigid region, regions of the insulating layer in the first and second rigid regions are planar, and the insulating layer in the flexible region includes a plurality of planar segments that are inclined relative to the planar regions of the insulating layer in the first and second rigid regions in the second direction.

27. The printed circuit board of claim 26, wherein the insulating layer in the flexible region further includes a plurality of arced segments disposed between planar segments in the flexible region.

28. The printed circuit board of claim 26, further comprising first and second wiring layers disposed on opposing surfaces of the insulating layer in the first rigid region, the flexible region, and the second rigid region, and more protective layers disposed on the first and second wiring layers in the first rigid region, the flexible region, and the second rigid region.

29. The printed circuit board of claim 26, wherein each of the first and second rigid regions further comprises a second insulating layer disposed on the insulating layer in the respective first or second rigid region and having a higher modulus of elasticity than the insulating layer extending across the first rigid region, the flexible region, and the second rigid region.

* * * * *